(12) United States Patent
Saitoh et al.

(10) Patent No.: US 11,871,615 B2
(45) Date of Patent: Jan. 9, 2024

(54) DISPLAY DEVICE AND METHOD FOR MANUFACTURING SAME

(71) Applicant: SHARP KABUSHIKI KAISHA, Sakai (JP)

(72) Inventors: Takao Saitoh, Sakai (JP); Masahiko Miwa, Sakai (JP); Yohsuke Kanzaki, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 413 days.

(21) Appl. No.: 17/298,844

(22) PCT Filed: Dec. 7, 2018

(86) PCT No.: PCT/JP2018/045150
§ 371 (c)(1),
(2) Date: Jun. 1, 2021

(87) PCT Pub. No.: WO2020/115906
PCT Pub. Date: Jun. 11, 2020

(65) Prior Publication Data
US 2022/0037436 A1 Feb. 3, 2022

(51) Int. Cl.
*H10K 59/121* (2023.01)
*H10K 59/131* (2023.01)
*H10K 59/12* (2023.01)

(52) U.S. Cl.
CPC ..... *H10K 59/1213* (2023.02); *H10K 59/1216* (2023.02); *H10K 59/131* (2023.02); *H10K 59/1201* (2023.02)

(58) Field of Classification Search
CPC ............ H10K 59/1213; H10K 59/131; H10K 59/1216; H10K 59/1201
USPC .......................................................... 257/40
See application file for complete search history.

(56) References Cited

U.S. PATENT DOCUMENTS

2011/0156024 A1* 6/2011 Koyama ............. H01L 27/1203
257/E27.084
2016/0181389 A1* 6/2016 Shin ................... H01L 29/42384
438/587

FOREIGN PATENT DOCUMENTS

JP H11-097699 A 4/1999

\* cited by examiner

*Primary Examiner* — Igwe U Anya
(74) *Attorney, Agent, or Firm* — ScienBiziP, P.C.

(57) ABSTRACT

A display device includes: a base substrate; a TFT layer including a plurality of pixel circuits arranged; and a light-emitting element layer. Each of the plurality of pixel circuits includes: a TFT including a semiconductor layer, a gate insulating film, and a gate electrode; and a capacitor including the gate electrode, a first inorganic insulating film, and a capacitive electrode. The capacitive electrode extends all around a perimeter of the gate electrode and extends to an outside of the perimeter. An angle formed between an upper surface of the base substrate and at least a part of an end surface in a circumferential direction of the gate electrode not overlapping the semiconductor layer in the plan view is greater than an angle formed between the upper surface of the base substrate and an end surface of the gate electrode overlapping the semiconductor layer in the plan view.

13 Claims, 24 Drawing Sheets

DISPLAY DEVICE AND METHOD FOR MANUFACTURING SAME

TECHNICAL FIELD

The disclosure relates to a display device and a method for manufacturing the same.

BACKGROUND ART

Attention has been recently drawn to self-emission organic EL displays using organic electroluminescence (EL) elements, as display devices instead of liquid-crystal displays. Such an organic EL display has sub-pixels, minimum units of an image, each of which includes a plurality of TFTs including a TFT for drive, and includes a capacitor electrically connected to the drive TFT.

For instance, Patent Literature 1 describes a coplanar (top-gate) TFT, in which an island-shaped gate electrode on a gate insulating film is electrically connected to a gate line via a connection electrode disposed on an interlayer insulating film covering the gate electrode.

CITATION LIST

Patent Literature

Patent Literature 1: Japanese Patent Application Laid-Open No. 11-97699

SUMMARY

Technical Problem

In a proposed organic EL display, the capacitor of each sub-pixel includes, for instance, a lower electrode and an upper electrode facing each other, and includes an inorganic insulating film disposed between the lower and upper electrodes. Each sub-pixel is structured such that the gate electrode of the drive TFT and the lower electrode of the capacitor are integrated to form an island shape. In the organic EL display having such a structure, electrostatic discharge (ESD) occurring during a process step for manufacturing the display can cause a short-circuit between the gate and upper electrodes in the capacitor of each sub-pixel, thus causing a short-circuit defect. A sub-pixel with a short-circuit defect can no longer display an image normally. One possible way to correct the short-circuit defect is separating the location of the short-circuit from the normal parts through laser-light irradiation. Unfortunately, correcting the short-circuit defect requires identifying the location of the short-circuit from the entire capacitor of the sub-pixel having the short-circuit defect, Such defect correction needs to be improved.

To solve this problem, it is an object of the disclosure to easily correct a short-circuit defect, which is caused by ESD in the capacitor of each sub-pixel.

Solution to Problem

To solve the above problem, the disclosure provides a display device that includes the following: a base substrate; a TFT layer disposed on the base substrate and including a plurality of pixel circuits arranged; and a light-emitting element layer disposed on the TFT layer. The light-emitting element layer includes a plurality of light-emitting elements arranged in correspondence with the plurality of pixel circuits. Each of the plurality of pixel circuits includes a TFT including a semiconductor layer, a gate insulating film, and a gate electrode. The gate insulating film covers the semiconductor layer. The gate electrode is provided in the form of an island overlapping a part of the semiconductor layer in a plan view on the gate insulating film. Each pixel circuit also includes a capacitor including the gate electrode, a first inorganic insulating film, and a capacitive electrode. The first inorganic insulating film is disposed on the gate electrode. The capacitive electrode overlaps the gate electrode in the plan view on the first inorganic insulating film. The capacitive electrode extends all around the perimeter of the gate electrode and extends to the outside of the perimeter. The angle formed between the upper surface of the base substrate and at least a part of an end surface in the circumferential direction of the gate electrode not overlapping the semiconductor layer in the plan view is greater than the angle formed between the upper surface of the base substrate and an end surface of the gate electrode overlapping the semiconductor layer in the plan view.

Advantageous Effect of Disclosure

In the disclosure, the angle formed between the upper surface of the base substrate and at least the part of the end surface in the circumferential direction of the gate electrode not overlapping the semiconductor layer in the plan view is greater than the angle formed between the upper surface of the base substrate and the end surface of the gate electrode overlapping the semiconductor layer in the plan view. This facilitates correcting a short-circuit defect caused by ESD in the capacitor of each sub-pixel.

DESCRIPTION OF EMBODIMENTS

Embodiments of the disclosure will be detailed with reference to the drawings. The disclosure is not limited to the following embodiments.

First Embodiment

Figure 1:
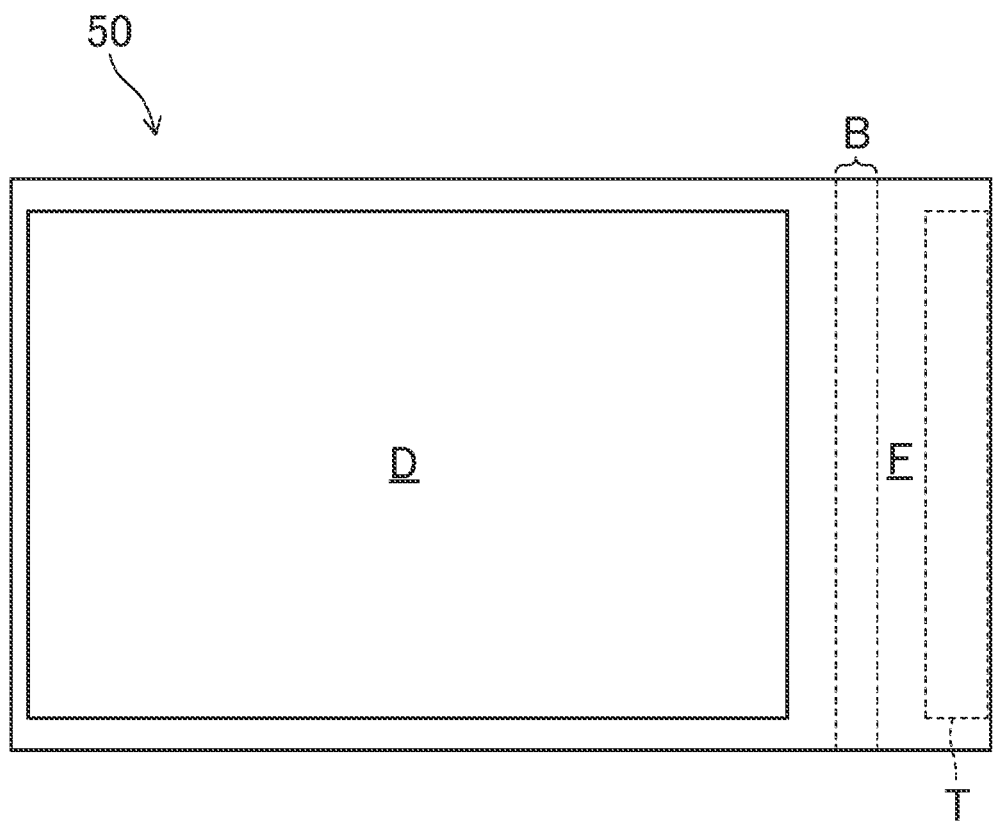
FIG. 1 is a schematic plan view of the configuration of an organic EL display according to a first embodiment of the disclosure.
Figure 2:
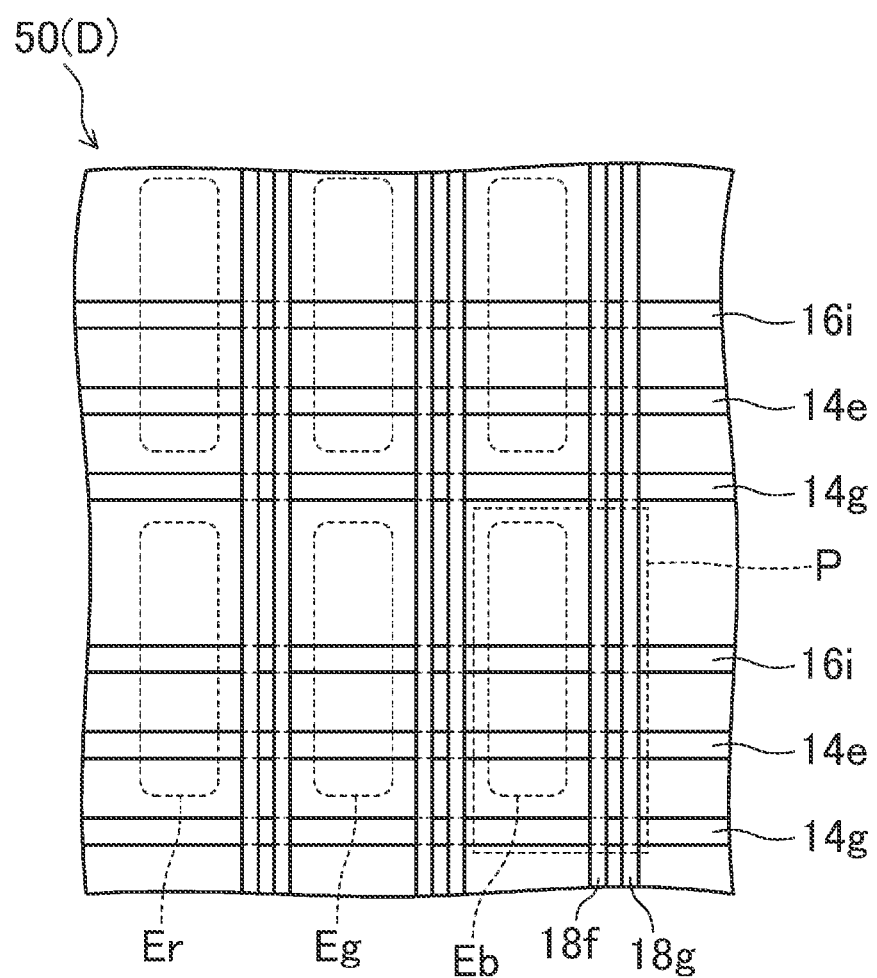
FIG. 2 is a plan view of a display region of the organic EL display according to the first embodiment of the disclosure.
Figure 3:
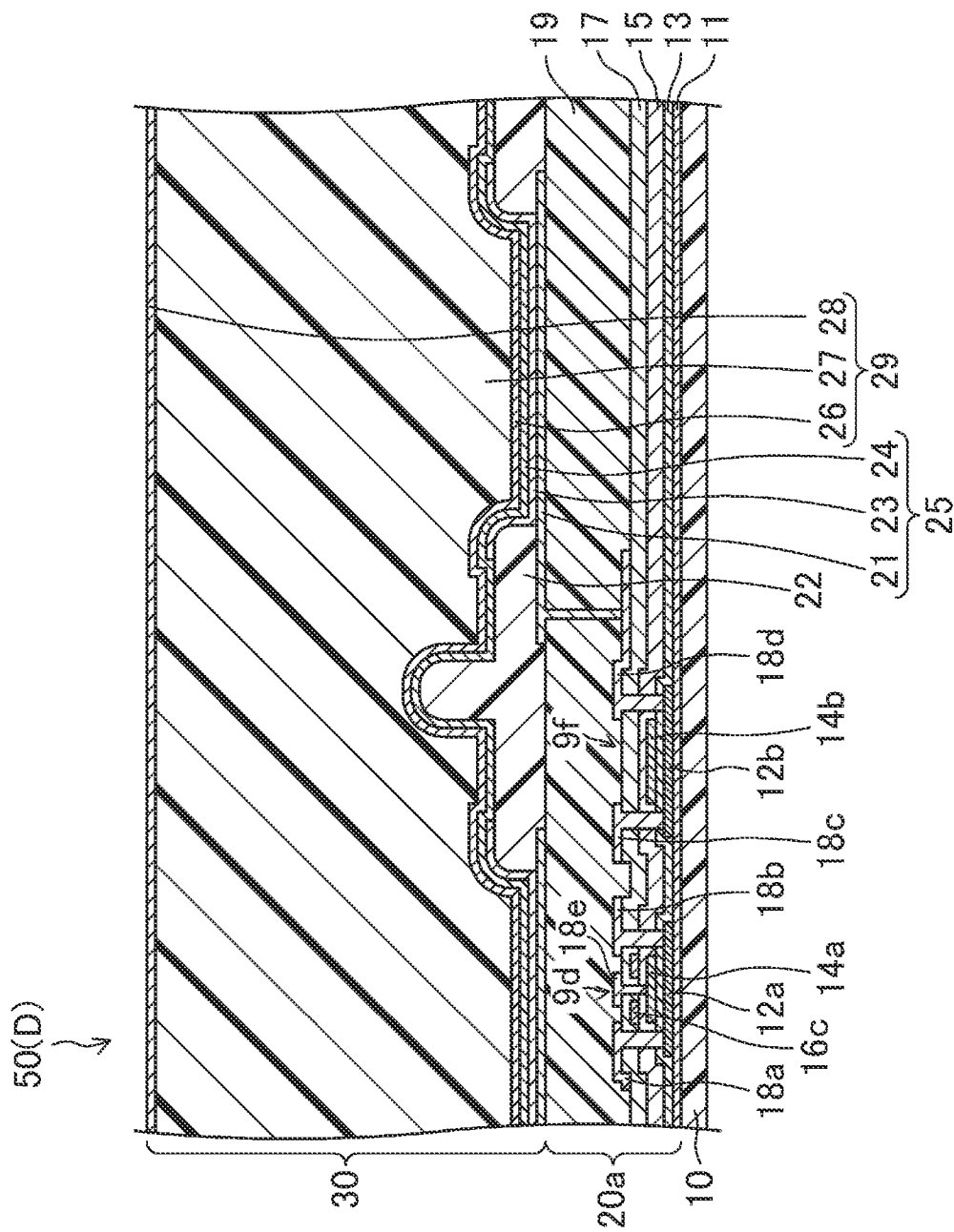
FIG. 3 is a sectional view of the display region of the organic EL display according to the first embodiment of the disclosure.
Figure 4:
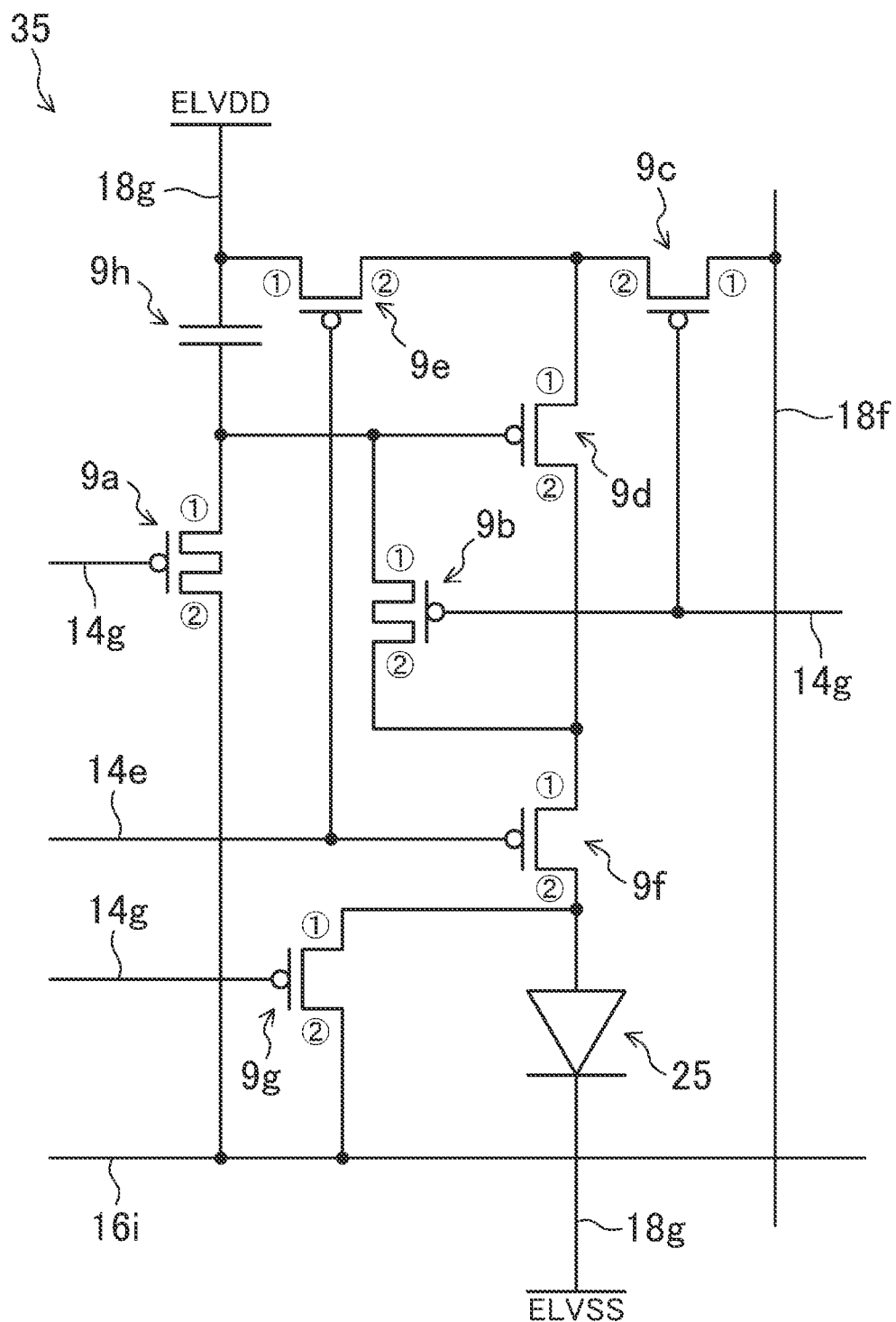
FIG. 4 is an equivalent circuit diagram illustrating a pixel circuit of the organic EL display according to the first embodiment of the disclosure.
Figure 5:
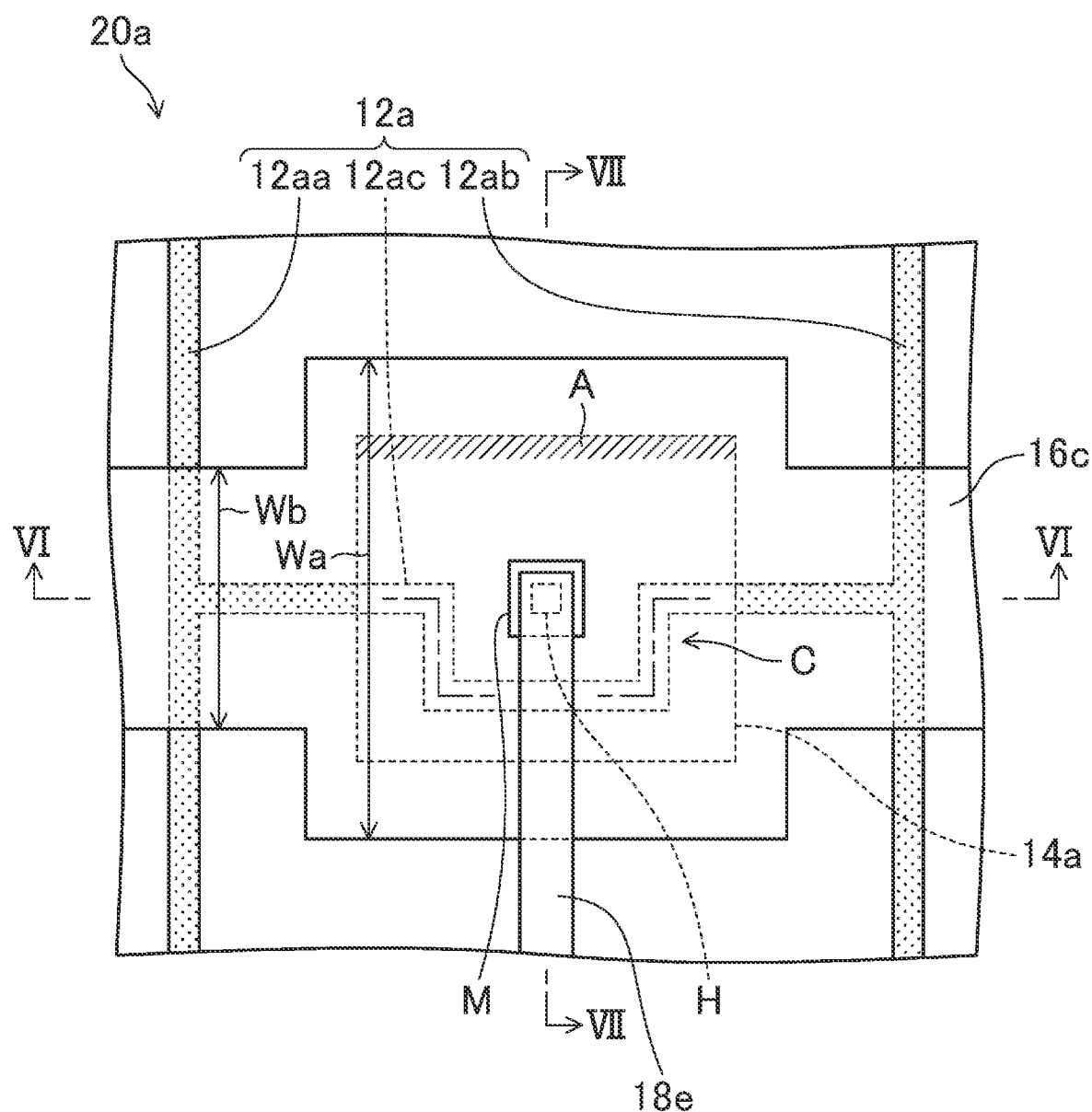
FIG. 5 is a plan view of a TFT layer forming the organic EL display according to the first embodiment of the disclosure.
Figure 6:
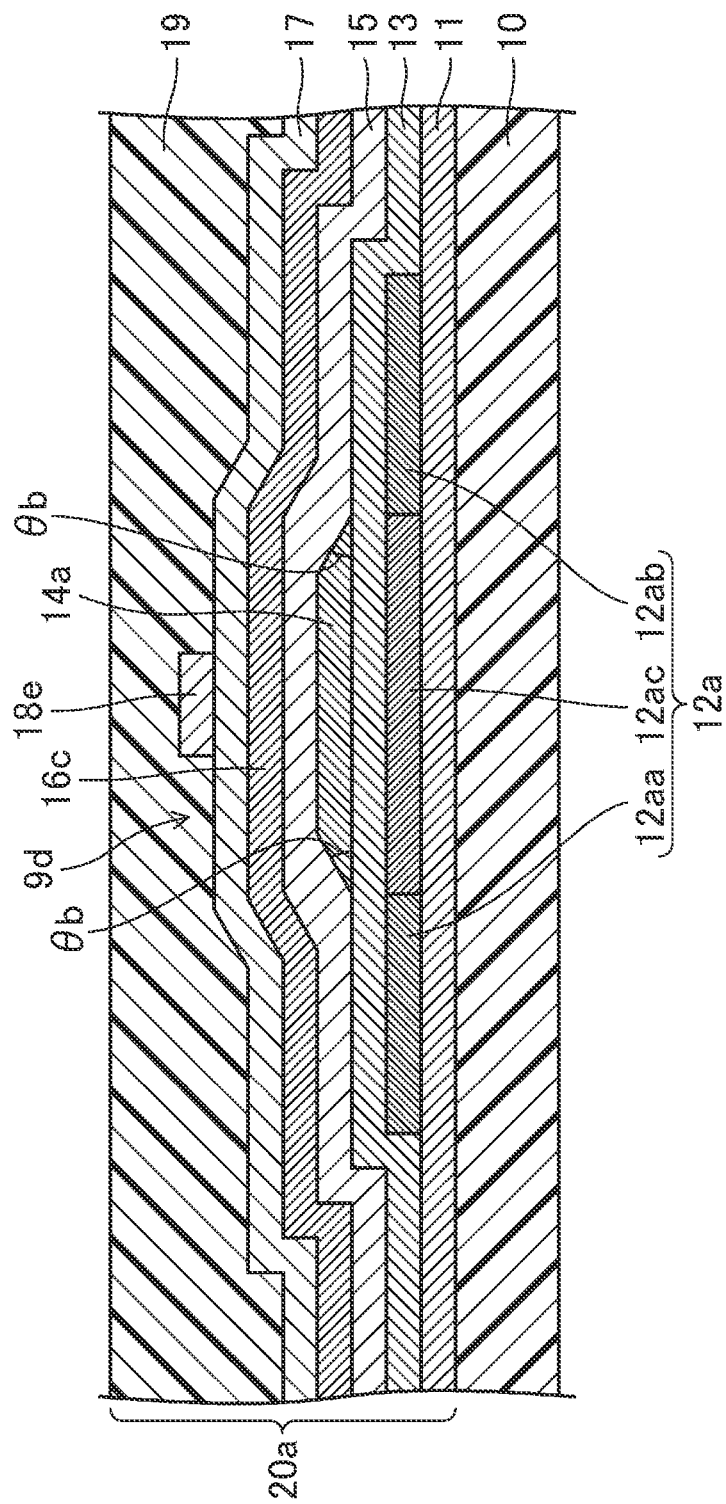
FIG. 6 is a sectional view of the TFT layer, which forms the organic EL display, taken along line VI-VI in FIG. 5.
Figure 7:
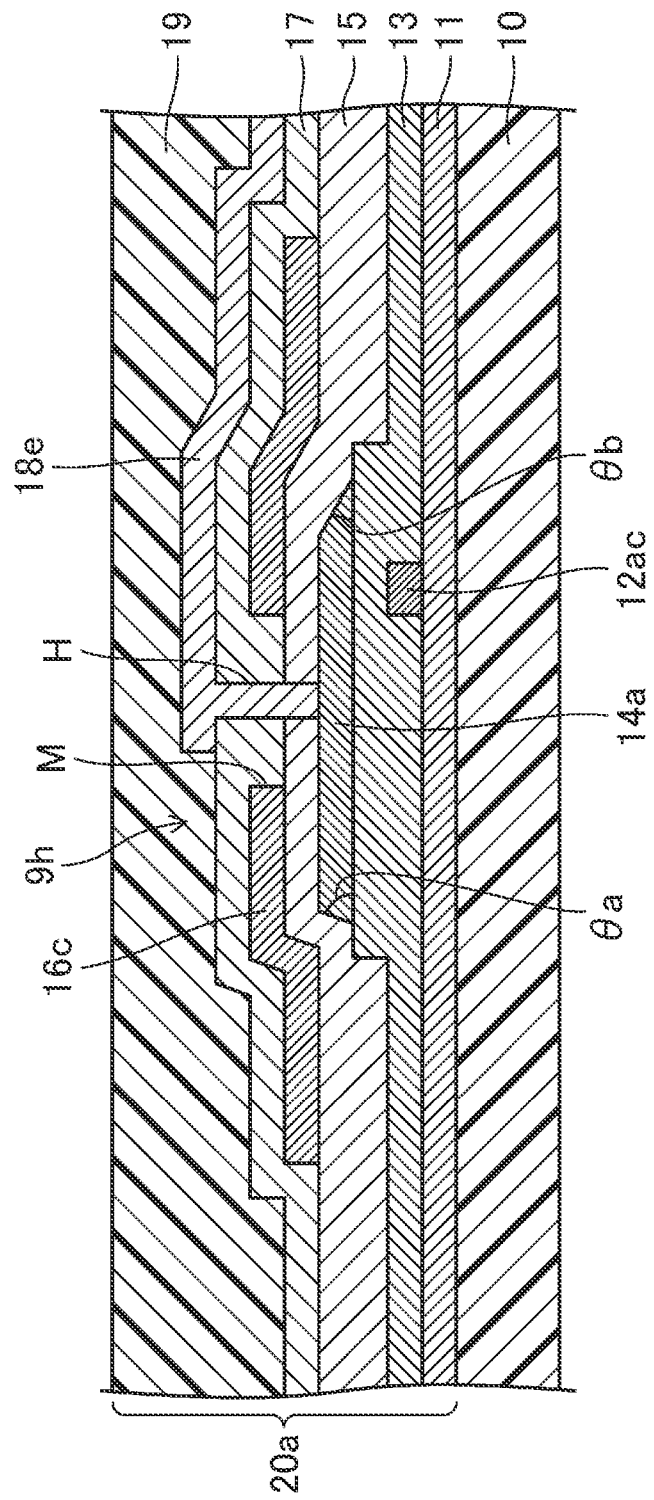
FIG. 7 is a sectional view of the TFT layer, which forms the organic EL display, taken along line VII-VII in FIG. 5.
Figure 8:
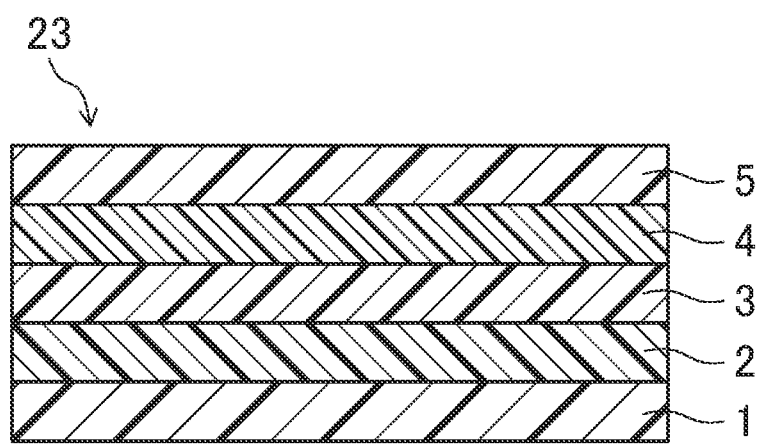
FIG. 8 is a sectional view of an organic EL layer forming the organic EL display according to the first embodiment of the disclosure.

FIGS. 1 to 24 illustrate a display device and a method for manufacturing the same according to a first embodiment of the disclosure. Each of the following embodiments describes an organic EL display that includes organic EL elements as an example of a display device that includes light-emitting elements. FIG. 1 is a schematic plan view of the configuration of an organic EL display 50 according to this embodiment. FIG. 2 is a plan view of a display region D of the organic EL display 50. FIG. 3 is a sectional view of the display region D of the organic EL display 50. FIG. 4 is an equivalent circuit diagram illustrating a pixel circuit 35 of the organic EL display 50. FIG. 5 is a plan view of a TFT layer 20a forming the organic EL display 50. FIG. 6 is a sectional view of the TFT layer 20a taken along line VI-VI in FIG. 5. FIG. 7 is a sectional view of the TFT layer 20a taken along line VII-VII in FIG. 5. FIG. 8 is a sectional view of an organic EL layer 23 forming the organic EL display 50.

As illustrated in FIG. 1, the organic EL display 50 includes the display region D having a rectangular shape and provided for image display, and includes a frame region F disposed around the display region D.

The display region D includes a plurality of sub-pixels P arranged in matrix, as illustrated in FIG. 2. The display region D is configured such that for instance, a sub-pixel P having a red light-emission region Er for red display, a sub-pixel P having a green light-emission region Eg for green display, and a sub-pixel P having a blue light-emission region Eb for blue display are adjacent to each other, as illustrated in FIG. 2. In the display region D, a single pixel consists of three adjacent sub-pixels P having a red light-emission region Er, a green light-emission region Eg, and a blue light-emission region Eb, for instance.

The frame region F includes a terminal section T disposed at its right end in FIG. 1. The frame region F also includes a bending portion B extending in one direction (the longitudinal direction of the drawing) between the display region D and terminal section T, as illustrated in FIG. 1. The bending portion B is, for instance, 180° (i.e., U-shape) bendable along an axis in the longitudinal direction of the drawing.

The organic EL display 50 includes the following, as illustrated in FIG. 3: a resin substrate layer 10, which is a base substrate; the thin-film-transistor (TFT) layer 20a disposed on the resin substrate layer 10; and an organic EL element layer 30, which is a light-emitting element layer, disposed on the TFT layer 20a.

The resin substrate layer 10 is made of polyimide resin for instance.

The TFT layer 20a includes the following, as illustrated in FIG. 3: a base coat film 11 disposed on the resin substrate layer 10; a first TFT 9a, a second. TFT 9b, a third TFT 9c, a fourth TFT 9d a fifth TFT 9e, a sixth TFT 9f, a seventh TFT 9g, and a capacitor 9h all disposed on the base coat film 11 and constituting a pixel circuit 35 (c.f., FIG. 4) in each sub-pixel P; and a flattening film 19 disposed on the first TFTs 9a to the seventh TFTs 9g and on the capacitors 9h. Here, the TFT layer 20a includes a plurality of pixel circuits 35 arranged in matrix and in correspondence with the plurality of sub-pixels P. The TFT layer 20a also includes a plurality of gate lines 14g extending in parallel with each other in the lateral direction of the drawing, as illustrated in FIG. 2. The TFT layer 20a also includes a plurality of light-emission control lines 14e extending in parallel with each other in the lateral direction of the drawing, as illustrated in FIG. 2. The TFT layer 20a also includes a plurality of initialization power-source lines 16i extending in parallel with each other in the lateral direction of the drawing, as illustrated in FIG. 2. As illustrated in FIG. 2, each light-emission control line 14e is adjacent to each gate line 14g and each initialization power-source line 16i. The TFT layer 20a also includes a plurality of source lines 18f extending in parallel with each other in the longitudinal direction of the drawing, as illustrated in FIG. 2. The TFT layer 20a also includes a plurality of power-source lines 18g extending in parallel with each other in the longitudinal direction of the drawing, as illustrated in FIG. 2. As illustrated in FIG. 2, each power-source line 18g is adjacent to each source line 18f.

Each of the first TFT 9a to seventh TFT 9g includes the following: a first terminal electrode (c.f., circled numeral 1 in FIG. 4) and a second terminal electrode (c.f., circled numeral 2 in FIG. 4) spaced away from each other; and a gate electrode for controlling the continuity between the first and second terminal electrodes.

The first TFT 9a serves as a TFT for initialization. In each sub-pixel P, the first TFT 9a has the following, as illustrated in FIG. 4: a gate electrode electrically connected to the corresponding gate line 14g; a first terminal electrode electrically connected to a gate electrode 14a (described later on) of the capacitor 9h; and a second terminal electrode electrically connected to the corresponding initialization power-source line 16i. Here, upon application of a voltage of the initialization power-source line 16i across the capacitor 9h, the first TFT 9a is designed to initialize a voltage applied to the gate electrode of the fourth TFT 9d. The first terminal electrode of the first TFT 9a is electrically connected to the gate line 14g that undergoes scanning immediately before the gate lines 14g electrically connected to the respective gate electrodes of the second TFT 9b, third TFT 9c and seventh TFT 9g.

The second TFT 9b serves as a TFT for compensation. In each sub-pixel P, the second TFT 9b has the following, as illustrated in FIG. 4: a gate electrode electrically connected to the corresponding gate line 14g; a first terminal electrode electrically connected to the gate electrode of the fourth TFT 9d; and a second terminal electrode electrically connected to the second terminal electrode of the fourth TFT 9d. Here, the second TFT 9b is designed to bring the fourth TFT 9d into diode connection in response to selection of the gate line 14g, to compensate a threshold voltage across the fourth TFT 9d.

The third TFT 9c serves as a TFT for write. In each sub-pixel P, the third TFT 9c has the following, as illustrated in FIG. 4: a gate electrode electrically connected to the corresponding gate line 14g; a first terminal electrode electrically connected to the corresponding source line 18f; and a second terminal electrode electrically connected to the first terminal electrode of the fourth TFT 9d. Here, the third TFT 9c is designed to apply a voltage of the source line 18f to the first terminal electrode of the fourth TFT 9d in response to selection of the gate line 14g.

The fourth TFT 9d is a TFT for drive. In sub-pixel P, the fourth TFT 9d has the following, as illustrated in FIG. 4: a gate electrode electrically connected to the first terminal electrodes of the respective first TFT 9a and second TFT 9b; a first terminal electrode electrically connected to the second terminal electrodes of the third TFT 9c and fifth TFT 9e; and a second terminal electrode electrically connected to the second terminal electrode of the second TFT 9b and to the first terminal electrode of the sixth TFT 9f. Here, the fourth TFT 9d is designed to apply, to the first terminal electrode of the sixth TFT 9f, a drive current based on a voltage applied between the gate electrode and first terminal electrode of the fourth TFT 9d.

To be specific, the fourth TFT 9d includes the following components sequentially disposed on the base coat film 11, as illustrated in FIGS. 3 and 6: a semiconductor layer 12a, a gate insulating film 13, the gate electrode 14a, a first interlayer insulating film 15, a second interlayer insulating film 17, a first terminal electrode 18a, and a second terminal electrode 18b. Here, the semiconductor layer 12a is provided in the form of a substantial H-shape on the base coat film 11, as illustrated in FIG. 5. The semiconductor layer 12a includes the following, as illustrated in FIG. 5: a channel region 12ac overlapping the gate electrode 14a in a plan view; and a first conductor region 12aa (denoted by dots in the drawing) and a second conductor region 12ab (denoted by dots in the drawing) sandwiching the channel region 12ac. As illustrated in FIG. 5, the channel region 12ac has a middle part having a U-shape in a plan view, and has a recess C dented downward in the drawing. The semiconductor layer 12a is covered with the gate insulating film 13, as illustrated in FIGS. 3, 6, and 7. As illustrated in FIGS. 3, 5, and 6, the gate electrode 14a is provided in the form of a rectangular island overlapping the channel region 12ac of the semiconductor layer 12a in a plan view on the gate insulating film 13. As illustrated in FIGS. 3 and 6, the first interlayer insulating film 15 and the second interlayer insulating film 17 are sequentially disposed over the gate electrode 14a. As illustrated in FIG. 3, the first terminal electrode 18a and the second terminal electrode 18b are electrically connected to the first conductor region 12aa and second conductor region 12ab of the semiconductor layer 12a, respectively, via respective contact holes disposed in a stack of the gate insulating film 13, first interlayer insulating film 15 and second interlayer insulating film 17.

The gate electrode 14a has an end surface (hatched part A in the drawing) on one of the sides (upper side in FIG. 5) that is remote from the U-shaped recess C of the semiconductor layer 12a. The end surface on the one side forms, along with the upper surface of the resin substrate layer 10, an angle θa. The gate electrode 14a also has end surfaces on the three other sides (left, lower and right sides in FIG. 5) including parts overlapping the semiconductor layer 12a in a plan view. The end surface on each of the three other sides forms, along with the upper surface of the resin substrate layer 10, an angle θb. The angle θa is greater than the angle θb. Specific examples of the angles θa and θb include the following: when the angle θa is about 50°, the angle θb is about 45°; and when the angle θa is about 45°, the angle θb is about 30°. With this configuration, the first interlayer insulating film 15 is relatively thin (e.g., a thickness of about 90 nm) in a place (hatched part in FIG. 5) located on the one side (upper side in FIG. 5) of the gate electrode 14a, and is relatively thick (e.g., a thickness of about 100 nm) on the other three sides (left, lower and right sides in FIG. 5) of the gate electrode 14a. Here, at least a part of the gate electrode 14a in the circumferential direction needs to be configured, as described in a modification described later on for instance, such that the angle formed between the upper surface of the resin substrate layer 10 and an end surface of the gate electrode 14a not overlapping the semiconductor layer 12a in a plan view is greater than the angle θb, which is formed between the upper surface of the resin substrate layer 10 and an end surface of the gate electrode 14a overlapping the semiconductor layer 12a in a plan view. It is noted that to facilitate correction in a correction step, which will described later on, such a part of the gate electrode 14a is preferably in a location not overlapping the semiconductor layer 12a in a plan view on one of the sides that is remote from the U-shaped recess C of the semiconductor layer 12a, as described in this embodiment.

The fifth TFT 9e is a TFT for power supply. In each sub-pixel P, the fifth TFT 9e has the following, as illustrated in FIG. 4: a gate electrode electrically connected to the corresponding light-emission control line 14e; a first terminal electrode electrically connected to the corresponding power-source line 18g; and a second terminal electrode electrically connected to the first terminal electrode of the fourth TFT 9d. Here, the fifth TFT 9e is designed to apply a voltage of the power-source line 18g to the first terminal electrode of the fourth TFT 9d in response to selection of the light-emission control line 14e.

The sixth TFT 9f is a TFT for controlling light emission. In each sub-pixel P, the sixth TFT 9f has the following, as illustrated in FIG. 4: a gate electrode electrically connected to the corresponding light-emission control line 14e; a first terminal electrode electrically connected to the second terminal electrode of the fourth TFT 9d; and a second terminal electrode electrically connected to a first electrode 21 of an organic EL element 25, which will be described later on. Here, the sixth TFT 9f is designed to apply the aforementioned drive current to the organic EL element 25 in response to selection of the light-emission control line 14e.

To be specific, the sixth TFT 9f includes the following components sequentially disposed on the base coat film 11, as illustrated in FIG. 3: a semiconductor layer 12b, the gate insulating film 13, a gate electrode 14b, the first interlayer insulating film 15, the second interlayer insulating film 17, a first terminal electrode 18c, and a second terminal electrode 18d. Here, the semiconductor layer 12b is provided in the form of an island on the base coat film 11, and includes a channel region and first and second conductor regions sandwiching the channel region, as illustrated in FIG. 3. The semiconductor layer 12b is covered with the gate insulating film 13, as illustrated in FIG. 3. As illustrated in FIG. 3, the gate electrode 14b overlaps the channel region of the semiconductor layer 12b on the gate insulating film 13. As illustrated in FIG. 3, the first interlayer insulating film 15 and the second interlayer insulating film 17 are sequentially disposed over the gate electrode 14b. As illustrated in FIG. 3, the first terminal electrode 18c and the second terminal electrode 18d are spaced from each other on the second interlayer insulating film 17. The first terminal electrode 18c and the second terminal electrode 18d are electrically connected to the first conductor region and second conductor region of the semiconductor layer 12b, respectively, via respective contact holes disposed in a stack of the gate insulating film 13, first interlayer insulating film 15 and second interlayer insulating film 17, as illustrated in FIG. 3. It is noted that the first TFT 9a, the second TFT 9b, the third TFT 9c, the fifth TFT 9e, and the seventh TFT 9g are substantially of the same configuration as the sixth TFT 9f.

The seventh TFT 9g is a TFT for anode discharge. In each pixel P, the seventh TFT 9g has the following, as illustrated in FIG. 4: a gate electrode electrically connected to the corresponding gate line 14g; a first terminal electrode electrically connected to the organic EL element 25; and a second terminal electrode electrically connected to the corresponding initialization power-source line 16i. Here, the seventh TFT 9g is designed to reset an electric charge accumulating in the first electrode 21 of the organic EL element 25, in response to selection of the gate line 14g.

The capacitor 9h includes the following, as illustrated in FIGS. 3, 5, and 7: the gate electrode 14a; the first interlayer insulating film 15, which is a first inorganic insulating film, disposed on the gate electrode 14a; and a capacitive electrode 16c overlapping the gate electrode 14a in a plan view on the first interlayer insulating film 15. In each sub-pixel P, the capacitor 9h is configured such that as illustrated in FIG. 4, its gate electrode 14a is integrated with the gate electrode 14a of the fourth TFT 9d to be electrically connected to the gate electrode 14a of the fourth TFT 9d, such that its gate electrode 14a is electrically connected to the first terminal electrodes of the respective first TFT 9a and second TFT 9b, and such that its capacitive electrode 16c is electrically connected to the corresponding power-source line 18g. Here, the capacitor 9h is designed to accumulate electricity using a voltage of the corresponding source line 18f when the corresponding gate line 14g is selected, and holds the accumulated voltage, thus maintaining a voltage applied to the gate electrode of the fourth TFT 9d when the corresponding gate line 14g is not selected. As illustrated in FIG. 5, the capacitive electrode 16c extends all around the perimeter of the gate electrode 14a and extends to the outside of the perimeter of the gate electrode 14a. The capacitive electrode 16c has an opening M exposing the first interlayer insulating film 15, as illustrated in FIGS. 5 and 7. The capacitive electrode 16c is covered with the second interlayer insulating film 17, which is a second inorganic insulating film, as illustrated in FIGS. 6 and 7. The second interlayer insulating film 17 is covered with a connection wire 18e electrically connected to the gate electrode 14a via a contact hole H disposed in the first interlayer insulating film 15 and second interlayer insulating film 17 exposed from the opening M of the capacitive electrode 16c. The connection wire 18e is orthogonal to the channel region 12ac of the semiconductor layer 12a in the recess C of the semiconductor layer 12a and is electrically connected to the corresponding gate line 14g, as illustrated in FIG. 5. The capacitive electrode 16c not overlapping the gate electrode 14a in a plan view is electrically connected to the corresponding power-source line 18g. The capacitive electrode 16c is configured such that a width Wa of a portion overlapping the gate electrode 14a in a plan view is greater than a width Wb of a portion not overlapping the gate electrode 14a in a plan view, as illustrated in FIG. 5. The opening M of the capacitive electrode 16c overlaps the recess C of the semiconductor layer 12a in a plan view, as illustrated in FIG. 5.

The organic EL element layer 30 includes the following, as illustrated in FIG. 3: a plurality of organic EL elements 25, which are a plurality of light-emitting elements, arranged in matrix on the flattening film 19; and a sealing film 29 covering the organic EL elements 25.

As illustrated in FIG. 3, each organic EL element 25 includes the following: the first electrode 21 disposed on the flattening film 19; the organic EL layer 23 disposed on the first electrode 21; and a second electrode 24 disposed on the organic EL layer 23 and provided in common in the entire display region D.

The first electrode 21 is electrically connected to the second terminal electrode of the sixth TFT 9f of each sub-pixel P via a contact hole disposed in the flattening film 19, as illustrated in FIG. 3. The first electrode 21 is capable of injecting holes (positive holes) into the organic EL layer 23. The first electrode 21 is more preferably made of material having a large work function in order to improve the efficiency of hole injection into the organic EL layer 23. The first electrode 21 is made of metal, including silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). In some cases, the first electrode 21 may be made of alloy of astatine (At) and astatine oxide ($AtO_2$) for instance. Alternatively, the first electrode 21 may be made of conductive oxide, including tin oxide (SnO), zinc oxide (ZnO), indium tin oxide (ITO), and indium zinc oxide (IZO). Alternatively, the first electrode 21 may be composed of a stack of multiple layers made of the above materials. Here, examples of a compound material having a large work function include an indium tin oxide (ITO) and an indium zinc oxide (IZO).

The first electrode 21 has an edge covered with an edge cover 22, which is provided in the form of a lattice all across the display region D. The edge cover 22 is made of positive photosensitive resin, including polyimide resin, acrylic resin, polysiloxane resin, and novolak resin.

The organic EL layer 23 includes the following layers sequentially disposed on the first electrode 21, as illustrated in FIG. 8: a hole injection layer 1, a hole transport layer 2, a light-emitting layer 3, an electron transport layer 4, and an electron injection layer 5.

The hole injection layer 1 is also called an anode buffer layer, and is capable of bringing the energy levels of the first electrode 21 and organic EL layer 23 close to each other to improve the efficiency of hole injection from the first electrode 21 to the organic EL layer 23. Examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 is capable of improving the efficiency of hole transport from the first electrode 21 to the organic EL layer 23. Examples of the material of the hole transport layer 2 include a porphyrin derivative, an aromatic tertiary amine compound, a styrylamine derivative, polyvinylcarbazote, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24 upon voltage application via the first electrode 21 and the second electrode 24, and is a region where the holes and electrons rejoin. The light-emitting layer 3 is made of material having high efficiency of light emission. Examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 is capable of moving electrons to the light-emitting layer 3 efficiently. The electron transport layer 4 is composed of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 is capable of bringing the energy levels of the second electrode 24 and organic EL layer 23 close to each other to improve the efficiency of electron injection from the second electrode 24 into the organic EL layer 23. This function can lower voltage for driving the organic EL element 25. The electron injection layer 5 is also called a cathode buffer layer. Herein, examples of the material of the electron injection layer 5 include an inorganic alkali compound (e.g., LiF or lithium fluoride, $MgF_2$ or magnesium fluoride, $CaF_2$ or calcium fluoride, $SrF_2$ or strontium fluoride, and $BaF_2$ or barium fluoride), an aluminum oxide ($Al_2O_3$), and a strontium oxide (SrO).

The second electrode 24 covers the organic layer 23 of each sub-pixel P and the edge cover 22, which is in common to all the sub-pixels P, as illustrated in FIG. 3. The second electrode 24 is capable of injecting electrons into the organic EL layer 23. The second electrode 24 is more preferably made of material having a small work function, in order to improve the efficiency of electron injection into the organic EL layer 23. Here, examples of the material of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Alternatively, the second electrode 24 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Alternatively, the second electrode 24 may be made of conductive oxide, including tin oxide (SnO), zinc oxide (ZnO), indium tin oxide (ITO), and indium zinc oxide (IZO). Alternatively, the second electrode 24 may be composed of a stack of multiple layers made of the above materials. Examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The sealing film 29 includes the following, as illustrated in FIG. 3: a first inorganic insulating sealing film 26 covering the second electrodes 24; an organic sealing film 27 disposed on the first inorganic insulating sealing film 26; and a second inorganic insulating sealing film 28 covering the organic sealing film 27. The sealing film 29 is capable of protecting the organic EL layers 23 from moisture, oxygen, and other things. The first inorganic insulating sealing film 26 and the second inorganic insulating sealing film 28 are made of inorganic material, including silicon oxide ($SiO_2$), aluminum oxide ($Al_2O_3$), silicon nitride (SiNx, where x is a positive number; an example of silicon nitride is $Si_3N_4$ or trisilicon tetranitride), and silicon carbonitride (SiCN). The organic film 27 is made of organic material, including acrylic resin, polyurea resin, parylene resin, polyimide resin, and polyamide resin.

In the organic EL display 50 having the foregoing configuration, firstly, the organic EL element 25 in each sub-pixel P does not emit light when the corresponding light-emission control line 14e is selected and rendered inactive.

Under this non-emission condition, the corresponding gate line 14g (electrically connected to the first TFT 9a) is selected, and a gate signal is input to the first TFT 9a via the gate line 14g. The first TFT 9a is accordingly turned on, thus applying a voltage of the corresponding initialization power-source line 16i across the capacitor 9h and turning on the fourth TFT 9d. The electric charge in the capacitor 9h is accordingly discharged, thus initializing a voltage applied to the gate electrode 14a of the fourth TFT 9d. Secondly, the second TFT 9b and the third TFT 9c are turned on when the corresponding gate lines 14g (electrically connected to the second TFT 9b, third TFT 9c and seventh TFT 9g) is selected and rendered active. Accordingly, a predetermined voltage corresponding to a source signal, transmitted via the corresponding source line 18f, is written to the capacitor 9h via the fourth TFT 9d that is in diode connection, and the seventh TFT 9g is turned on. An initialization signal is accordingly applied to the first electrode 21 of the organic EL element 25 via the corresponding initialization power-source line 16i, thereby resetting the electric charge accumulating in the first electrode 21. Thereafter, the corresponding light-emission control line 14e is selected to turn on the fifth TFT 9e and sixth TFT 9f, thus supplying, from the corresponding power-source line 18g to the organic EL element 25, a drive current based on the voltage applied to the gate electrode 14a of the fourth TFT 9d. As described above, the organic EL display 50 is configured such that the organic EL element 25 in each sub-pixel P emits light at a brightness level based on a drive current, thus displaying an image.

Figure 9:
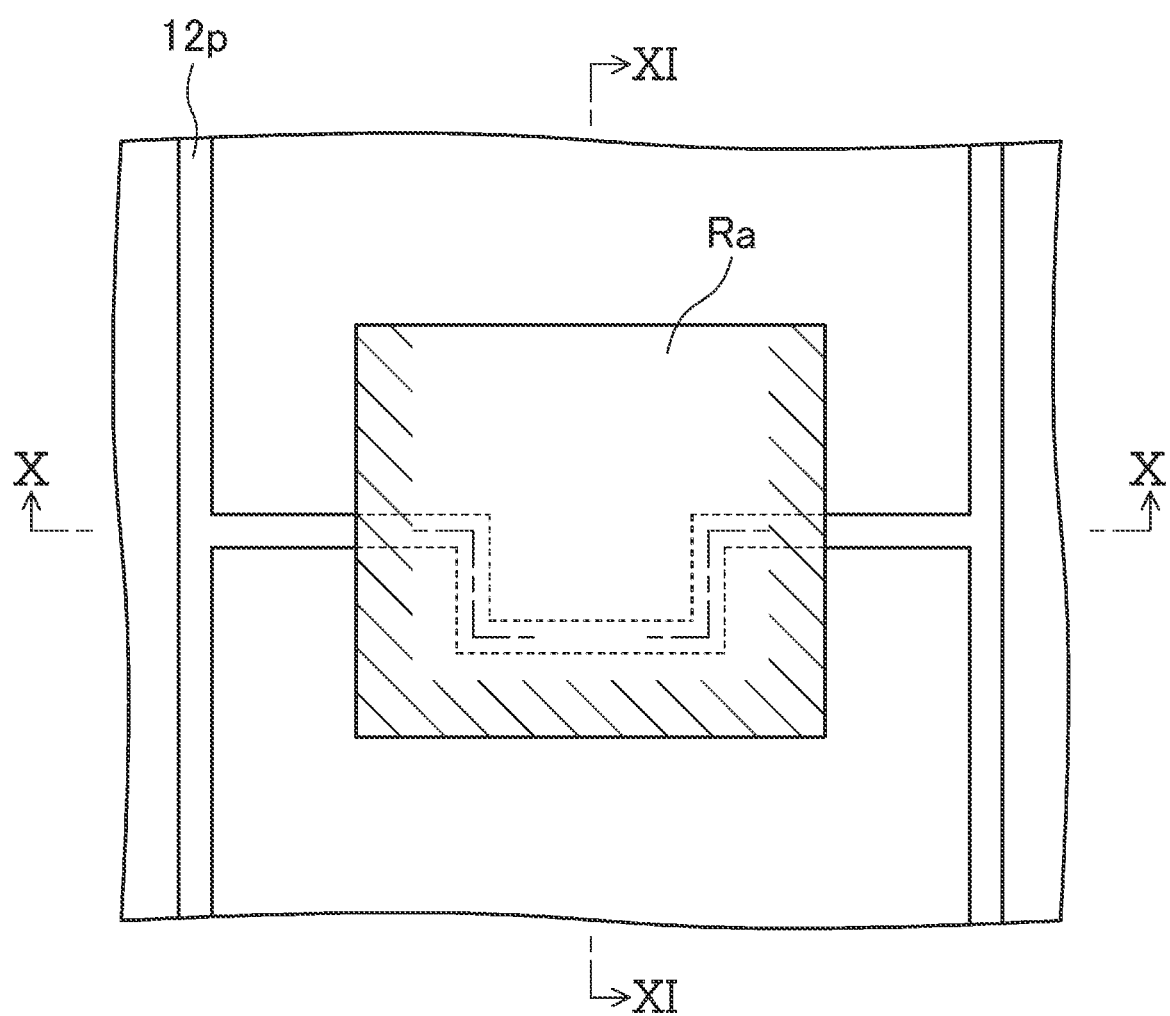
FIG. 9 illustrates, in a plan view, a step of forming a resist pattern, which is included in a step of forming a gate electrode included in a method for manufacturing the organic EL display according to the first embodiment of the disclosure.
Figure 10:
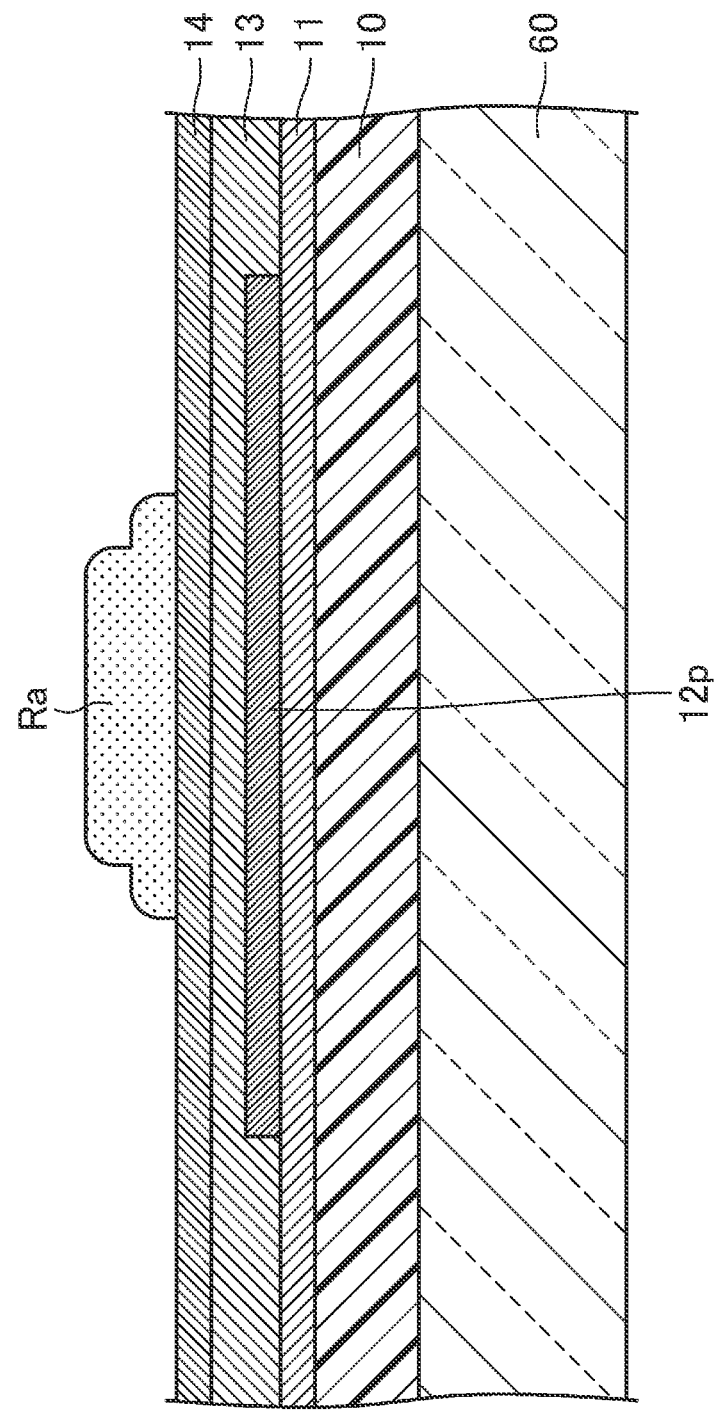
FIG. 10 is a sectional view taken along line X-X in FIG. 9.
Figure 11:
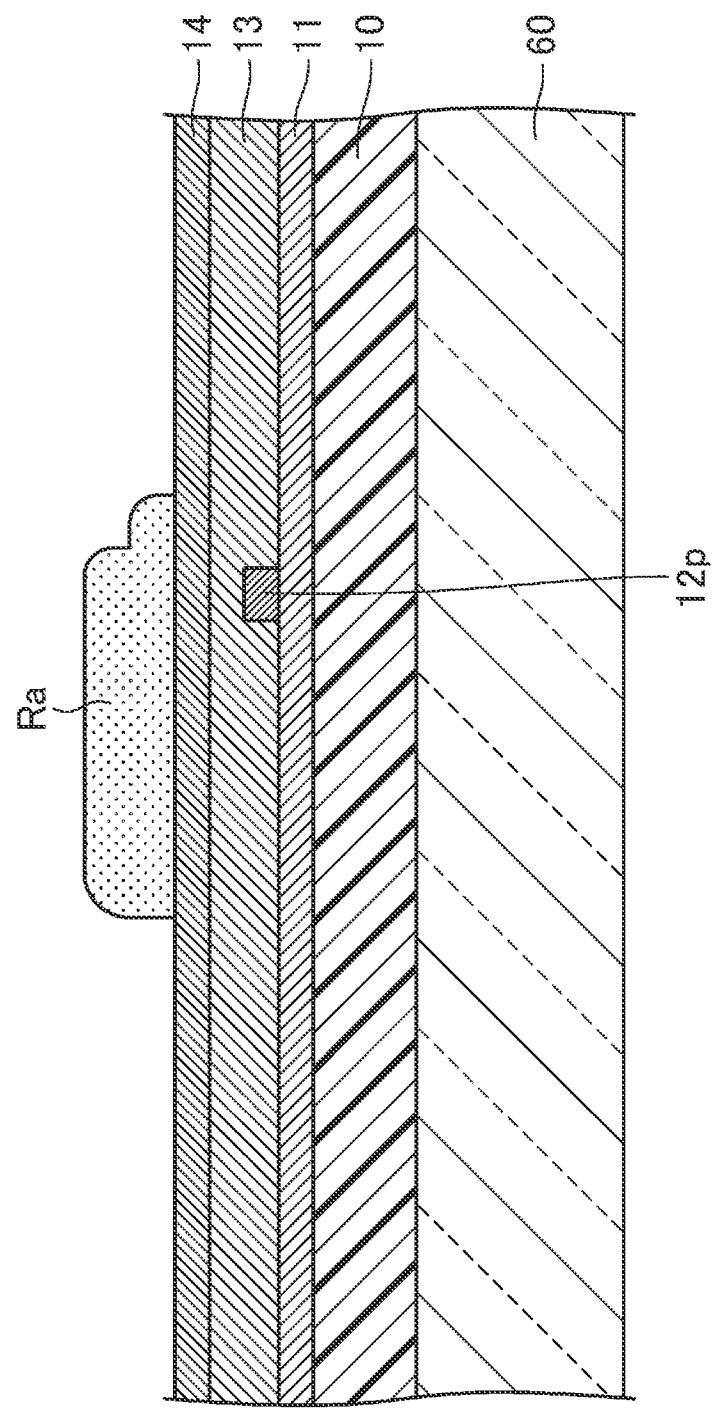
FIG. 11 is a sectional view taken along line XI-XI in FIG. 9.
Figure 12:
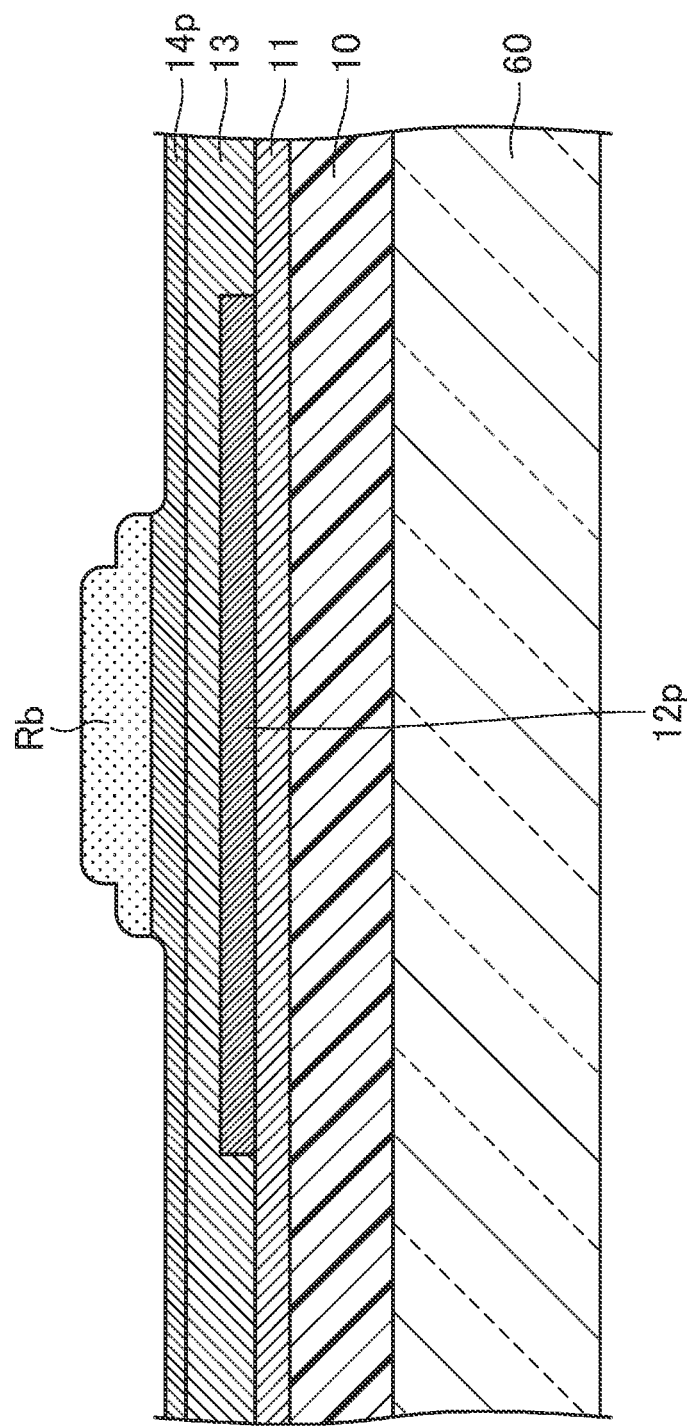
FIG. 12 illustrates a first etching step in a sectional view and corresponds to FIG. 10. The first etching step is included in the step of forming the gate electrode of the method for manufacturing the organic EL display according to the first embodiment of the disclosure.
Figure 13:
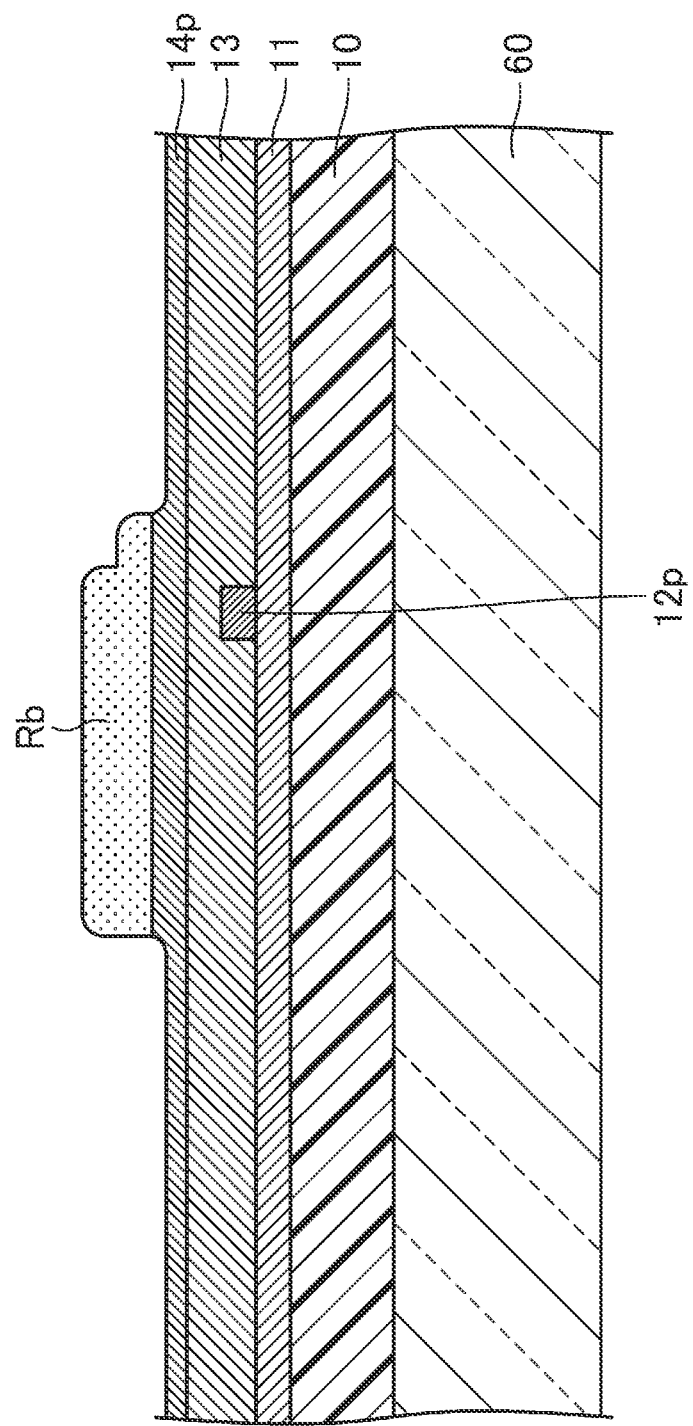
FIG. 13 illustrates the first etching step in a sectional view and corresponds to FIG. 11. The first etching step is included in the step of forming the gate electrode of the method for manufacturing the organic EL display according to the first embodiment of the disclosure.
Figure 14:
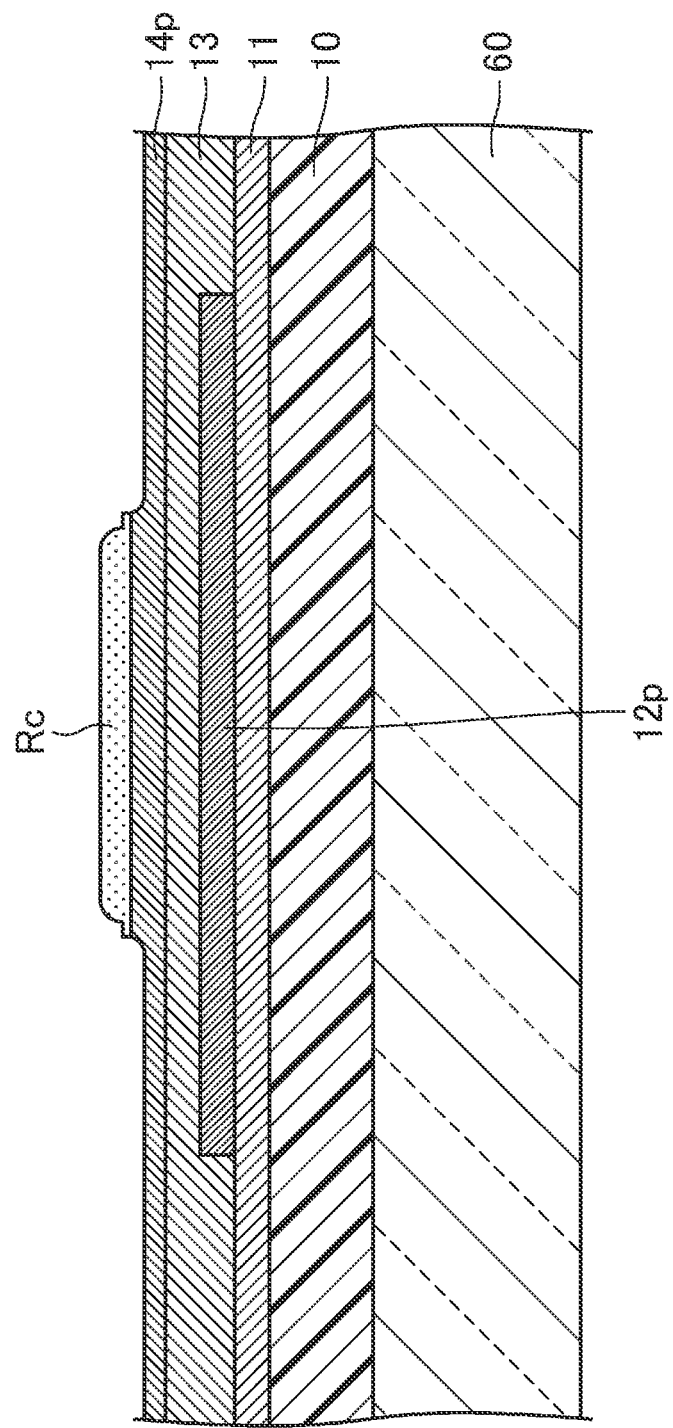
FIG. 14 illustrates an ashing step in a sectional view and corresponds to FIG. 10. The ashing step is included in the step of forming the gate electrode of the method for manufacturing the organic EL display according to the first embodiment of the disclosure.
Figure 15:
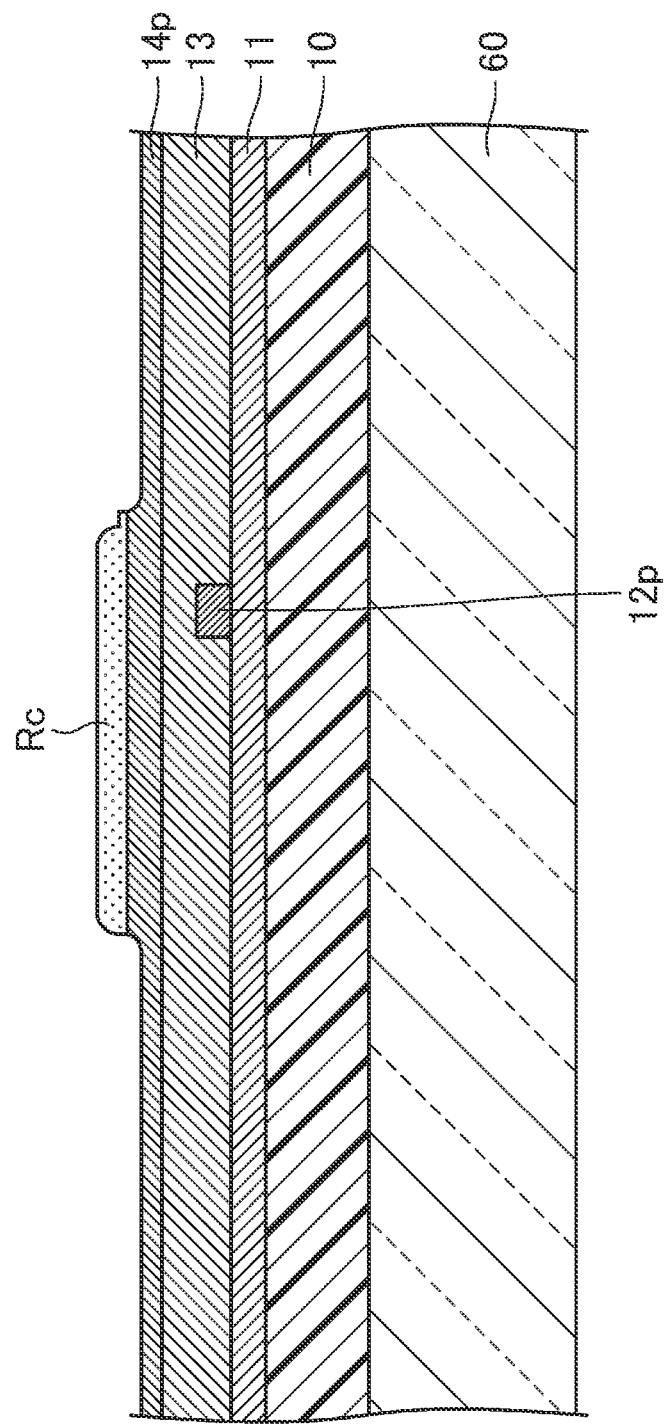
FIG. 15 illustrates the ashing step in a sectional view and corresponds to FIG. 11. The ashing step is included in the step of forming the gate electrode of the method for manufacturing the organic EL display according to the first embodiment of the disclosure.
Figure 16:
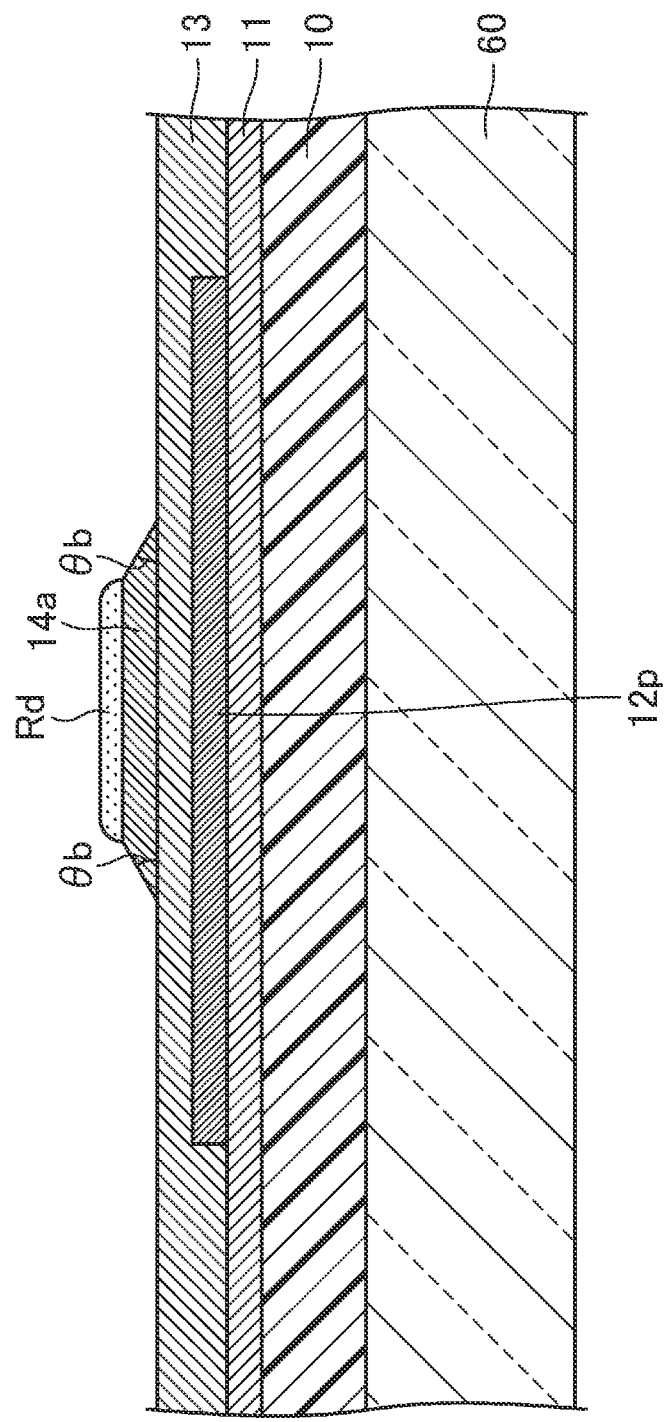
FIG. 16 illustrates a second etching step in a sectional view and corresponds to FIG. 10. The second etching step is included in the step of forming the gate electrode of the method for manufacturing the organic EL display according to the first embodiment of the disclosure.
Figure 17:
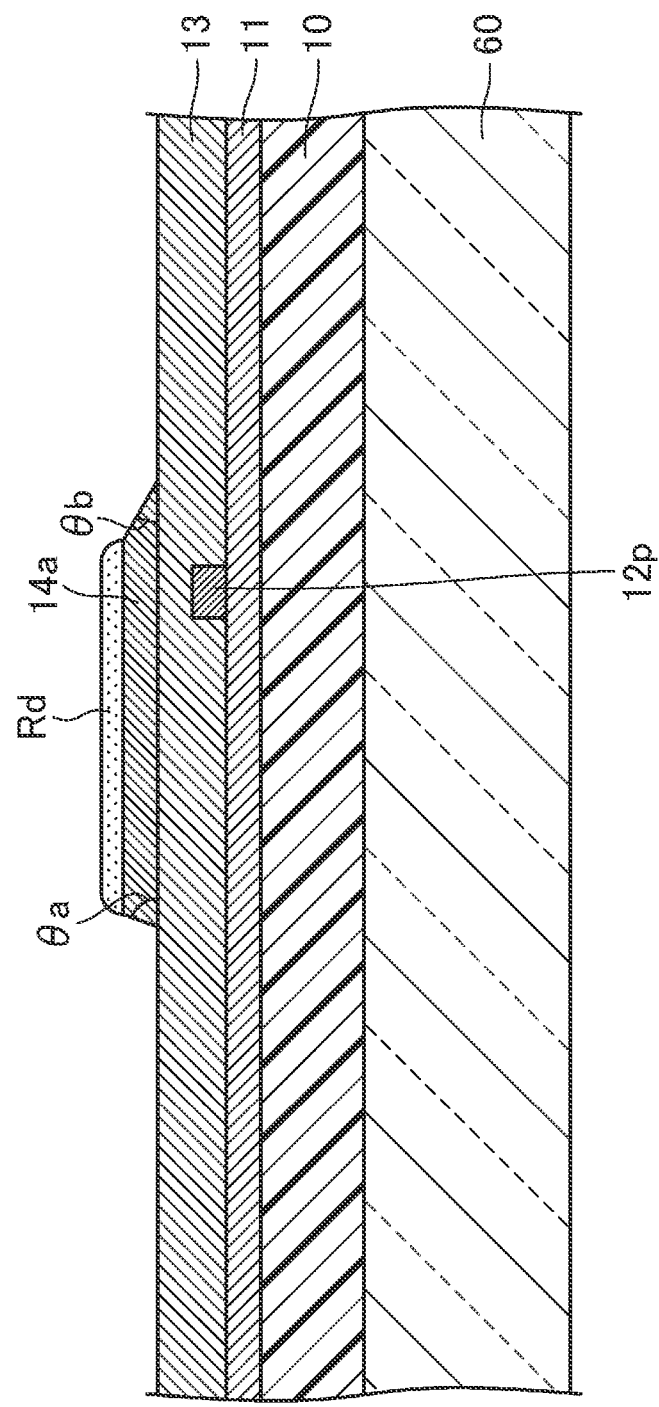
FIG. 17 illustrates the second etching step in a sectional view and corresponds to FIG. 11. The second etching step is included in the step of forming the gate electrode of the method for manufacturing the organic EL display according to the first embodiment of the disclosure.
Figure 18:
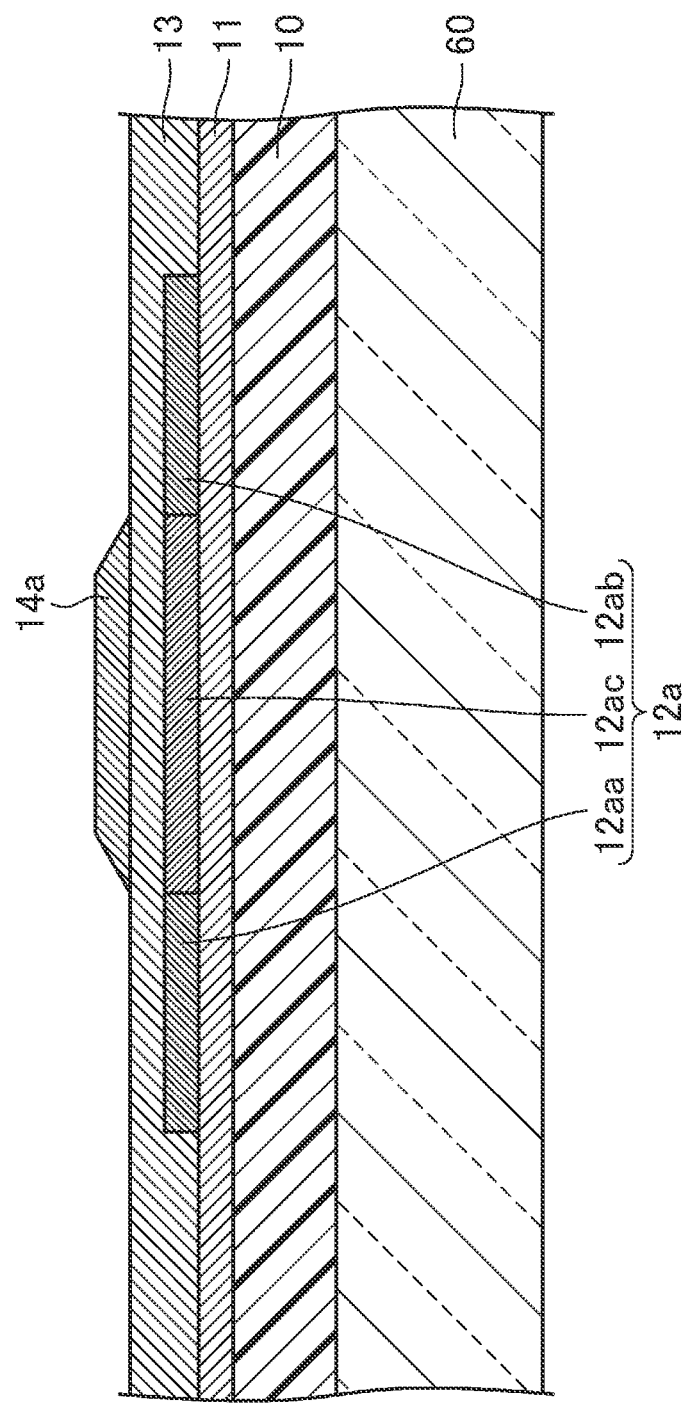
FIG. 18 illustrates a doping step in a sectional view and corresponds to FIG. 10. The doping step is included in the method for manufacturing the organic EL display according to the first embodiment of the disclosure.
Figure 19:
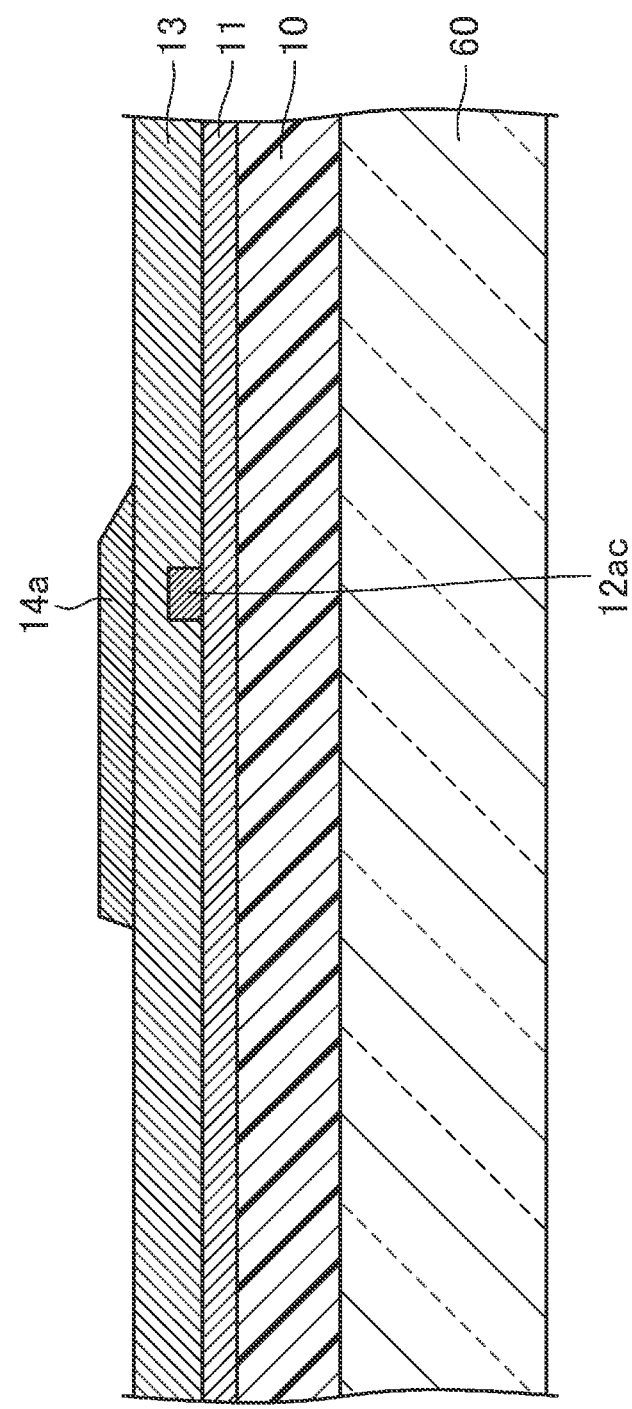
FIG. 19 illustrates the doping step in a sectional view and corresponds to FIG. 11. The doping step is included in the method for manufacturing the organic EL display according to the first embodiment of the disclosure.
Figure 20:
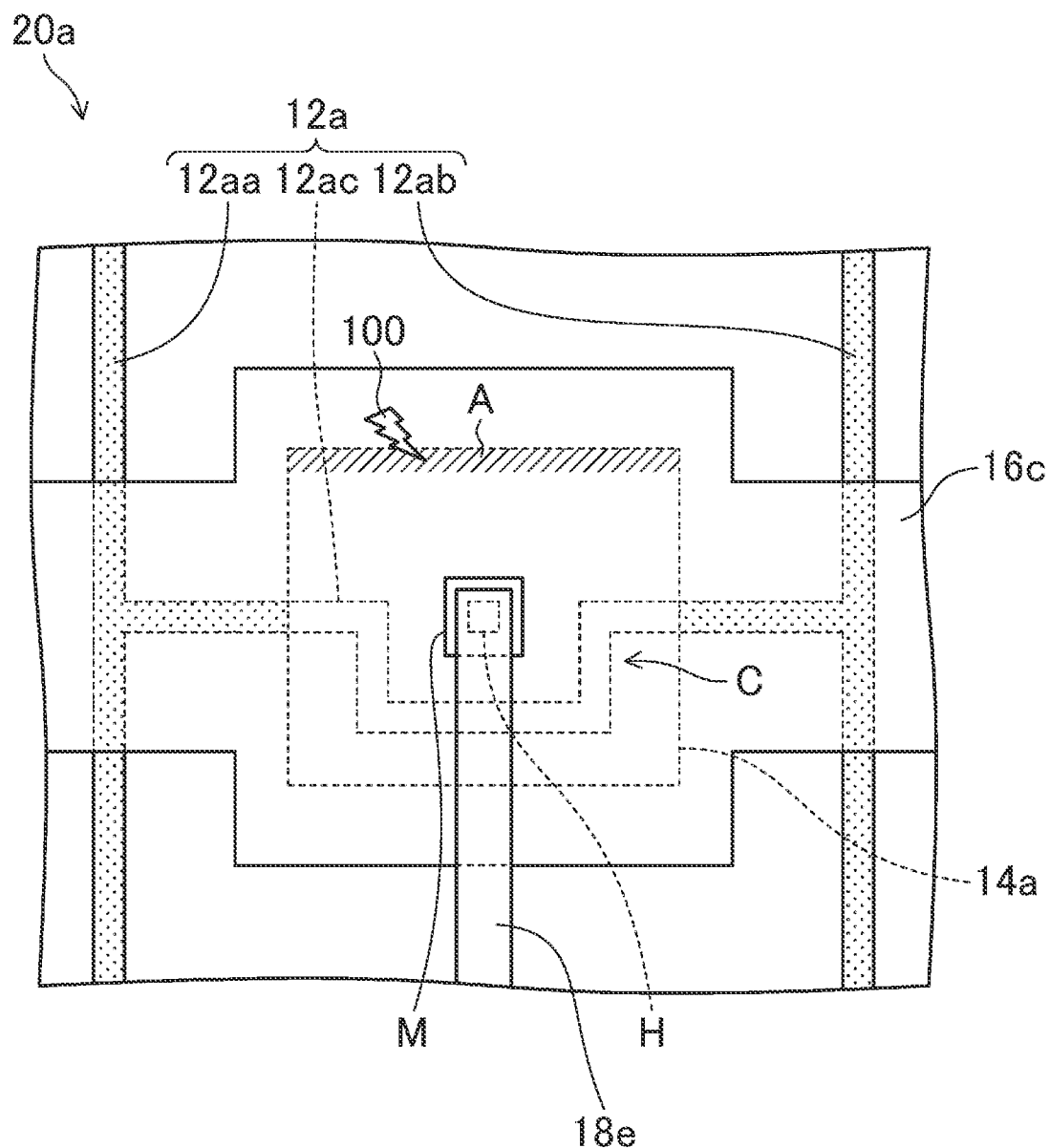
FIG. 20 illustrates, in a plan view, a step of short-circuit identification included in the method for manufacturing the organic EL display according to the first embodiment of the disclosure.
Figure 21:
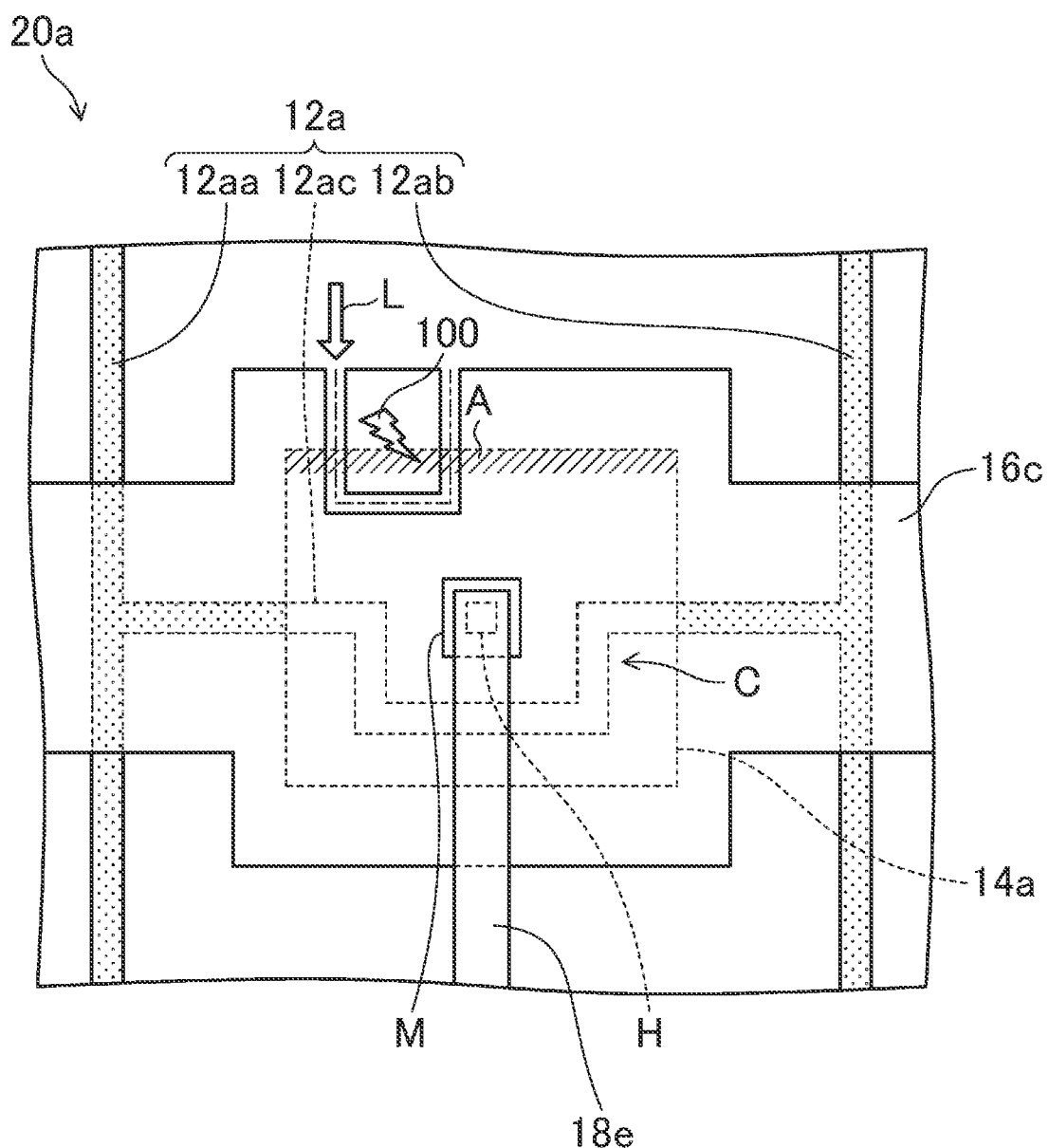
FIG. 21 illustrates, in a plan view, a correction step included in the method for manufacturing the organic EL display according to the first embodiment of the disclosure.

The following describes a method for manufacturing the organic EL display 50 according to this embodiment. The method for manufacturing the organic EL display 50 in this embodiment includes a step of forming a TFT layer, a step of short-circuit identification, a correction step, and a step of forming an organic EL element layer. FIG. 9 illustrates a step of forming a resist pattern in a plan view, which is included in a step of forming a gate electrode included in the step of forming the TFT layer in the method for manufacturing the organic EL display 50. FIGS. 10 and 11 are sectional views taken along line X-X and line XI-XI in FIG. 9. FIGS. 12 and 13 illustrate a first etching step in a sectional view, which is included in the step of forming the gate electrode, and correspond to FIGS. 10 and 11. FIGS. 14 and 15 illustrate an ashing step in a sectional view, which is included in the step of forming the gate electrode, and correspond to FIGS. 10 and 11. FIGS. 16 and 17 illustrate a second etching step in a sectional view, which is included in the step of forming the gate electrode, and correspond to FIGS. 10 and 11. FIGS. 18 and 19 illustrate a doping step in a sectional view, which is included in the step of forming the TFT layer, and correspond to FIGS. 10 and 11. FIG. 20 illustrates the step of short-circuit identification in a plan view, which is included in the method for manufacturing the organic EL display 50. FIG. 21 illustrates the correction step in a plan view, which is included in the method for manufacturing the organic EL display 50.

Step of Forming TFT Layer

Firstly, the base coat film 11 is formed by forming an inorganic insulating film (with a thickness of about 1000 nm), such as a silicon oxide film, onto the resin substrate layer 10, which is on a glass substrate 60 for instance, through plasma chemical vapor deposition (CVD) or other methods.

Subsequently, the substrate with the base coat film 11 thereon undergoes plasma CVD entirely to form, for instance an amorphous silicon film (with a thickness of about 50 nm). The amorphous silicon film then undergoes, for instance, laser annealing for crystallization to form a polysilicon film. The polysilicon film then undergoes patterning to form a semiconductor layer 12p and other things.

Then, the substrate with the semiconductor layer 12p and other things thereon undergoes, for instance, plasma CVD entirely to form an inorganic insulating film (with a thickness of about 100 nm), such as a silicon oxide film, thus forming the gate insulating film 13.

Furthermore, the step of forming the resist pattern is performed. In this process step, the substrate with the gate insulating film 13 thereon undergoes, for instance, sputtering to sequentially form an aluminum film (with a thickness of about 350 nm), a molybdenum nitride film (with a thickness of about 50 nm), and other films, thus forming a gate metal film 14. The gate metal film 14 then undergoes half exposure to form a resist pattern Ra, as illustrated in FIGS. 9 to 11. As illustrated in FIGS. 10 and 11, the resist pattern Ra is thinner in locations (hatched parts in the drawing) along the right, left and lower sides in FIG. 9 than in a location along the upper side in FIG. 9.

Subsequently, the first etching step is performed, in which the upper layer of the gate metal film 14 exposed from the resist pattern Ra is removed through dry etching to form a gate metal film 14p, as illustrated in FIGS. 12 and 13. The resist pattern Ra at this time is made to be thin by the dry etching to be a resist pattern Rb.

Then, the ashing step is performed, in which the resist pattern Rb undergoes ashing for thickness reduction to form a resist pattern Rc, as illustrated in FIGS. 14 and 15.

Thereafter, the second etching step is performed, in which as illustrated in FIGS. 16 and 17, the gate metal film 14p exposed from the resist pattern Rc is removed through dry etching to form each gate electrode 14a with its end surface on one side (upper side in FIG. 5) forming the angle θa, and with its end surfaces on the three other sides (right, left and lower sides in FIG. 5) forming the angle θb. The resist pattern Rc at this time is made to be thin by the dry etching to be a resist pattern Rd. It is noted that the gate electrodes 14b, gate lines 14g, light-emission control lines 14e and other things excluding the gate electrodes 14a are formed through patterning from the gate metal film 14 using a resist pattern formed through full exposure.

Furthermore, the doping step is performed, in which the resist pattern Rd is removed, followed by impurity ion doping by using the gate electrodes 14a and other things as a mask, to form, but not limited to, the semiconductor layers 12a, each having the first conductor region 12aa, second conductor region 12ab and channel region 12ac, as illustrated in FIGS. 18 and 19.

Thereafter, the substrate with the semiconductor layers 12a and other things thereon undergoes, for instance, plasma chemical vapor deposition (CVD) entirely to form an inorganic insulating film (with a thickness of about 100 nm), such as a silicon oxide film, thus forming the first interlayer insulating film 15.

Subsequently, the substrate with the first interlayer insulating film 15 thereon undergoes, for instance, sputtering entirely to sequentially form an aluminum film (with a thickness of about 350 nm), a molybdenum nitride film (with a thickness of about 50 nm), and other films. The stack of these metal films then undergoes patterning to form the capacitive electrodes 16c and other things.

Furthermore, the substrate with the capacitive electrodes 16c and other things thereon undergoes, for instance, plasma chemical vapor deposition (CVD) entirely to form an inorganic insulating film (with a thickness of about 500 nm), such as a silicon oxide film, thus forming the second interlayer insulating film 17. The stack of the first interlayer insulating film 15 and second interlayer insulating film 17 then undergoes patterning to form the contact holes H.

Then, the substrate with the contact holes H thereon undergoes, for instance, sputtering entirely to subsequently form a titanium film (with a thickness of about 30 nm), an aluminum film (with a thickness of about 300 nm), another titanium film (with a thickness of about 50 nm), and other films, thus forming a source metal film. The source metal film then undergoes patterning to form the connection wires 18e, the source lines 18f, the power-source lines 18g, and other things.

Finally, the substrate with the connection wires 18e and other things thereon is applied with a polyimide photosensitive resin film (with a thickness of about 2 µm) through, for instance, spin coating or slit coating. The applied film then undergoes pre-baking, exposure, development, and post-baking to form the flattening film 19.

The TFT layer 20a can be formed through these process steps.

Step of Identifying Short Circuit

In each of the pixel circuits 35 within the TFT layer 20a, formed in the step of forming the TFT layer, the upper side (hatched part A in the drawing) of the gate electrode 14a undergoes image processing, where an image captured by a charge-coupled-device (CCD) camera is processed, to identify a pixel circuit 35 with the gate electrode 14a and capacitive electrode 16c developing a short-circuit resulting from ESD 100. In some cases, no defects, such as a short-circuit resulting from ESD 100, are detected in each pixel circuit 35; accordingly, the correction step (described later on) is skipped, and the step of forming the organic EL element layer (described later on) is performed.

Correction Step

In the pixel circuit 35 that has been identified in the step of short-circuit identification, the capacitive electrode 16c undergoes U-shape scanning (c.f., a dot-dashed line in FIG. 21) while irradiation with laser light L around a portion of the short-circuit between the gate electrode 14a and capacitive electrode 16c to separate, from the capacitive electrode 16c, the portion of the short-circuit between the gate electrode 14a and capacitive electrode 16c, as illustrated in FIG. 21. Laser light L herein has a spot size of about 2.5 µm×2.5 µm, and is output from an yttrium-aluminum-garnet (YAG) laser or other kinds of laser. Although this embodiment has described an example method of cutting only the capacitive electrode 16c by laser light L, the capacitive electrode 16c and the gate electrode 14a overlapping the capacitive electrode 16c may be cut by laser light L.

Step of Forming Organic EL Element Layer

Through a well-known method, the first electrodes 21, the edge cover 22, and the organic EL layers 23 (the hole injection layers 1, the hole transport layers 2, the light-emitting layers 3, the electron transport layers 4, and the electron injection layers 5) and the second electrode 24 are formed onto the TFT layer 20a with the short-circuit defect corrected in the correction step or onto the flattening film 19 of the TFT layer 20a with no defects, such as a short-circuit, found in the identifying step. Thereafter, the sealing film 29 (the first inorganic insulating sealing film 26, the organic sealing film 27, and the second inorganic insulating sealing film 28) is formed, thereby forming the organic EL element layer 30.

Then, a protective sheet (not shown) is attached onto the substrate surface with the sealing film 29 thereon, followed by laser-light irradiation from the resin substrate layer 10 adjacent to the glass substrate 60 to peel the glass substrate 60 off from the lower surface of the resin substrate layer 10, followed by attachment of another protective sheet (not shown) onto the lower surface of the resin substrate layer 10 with the glass substrate peeled off therefrom.

The organic EL display 50 according to this embodiment can be manufactured through these process steps.

Figure 22:
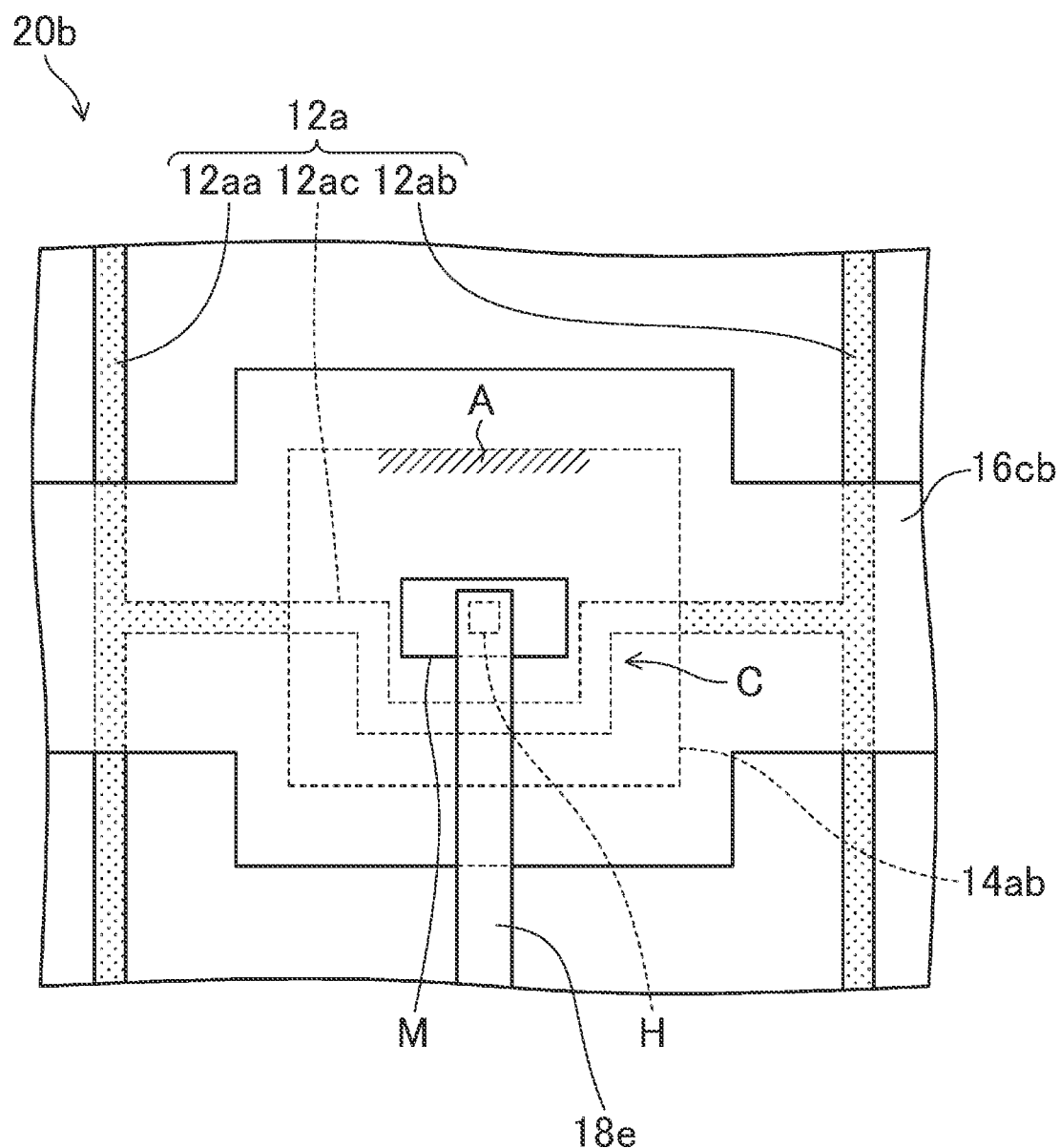
FIG. 22 is a plan view of a modified version of the TFT layer, which forms the organic EL display according to the first embodiment of the disclosure.
Figure 23:
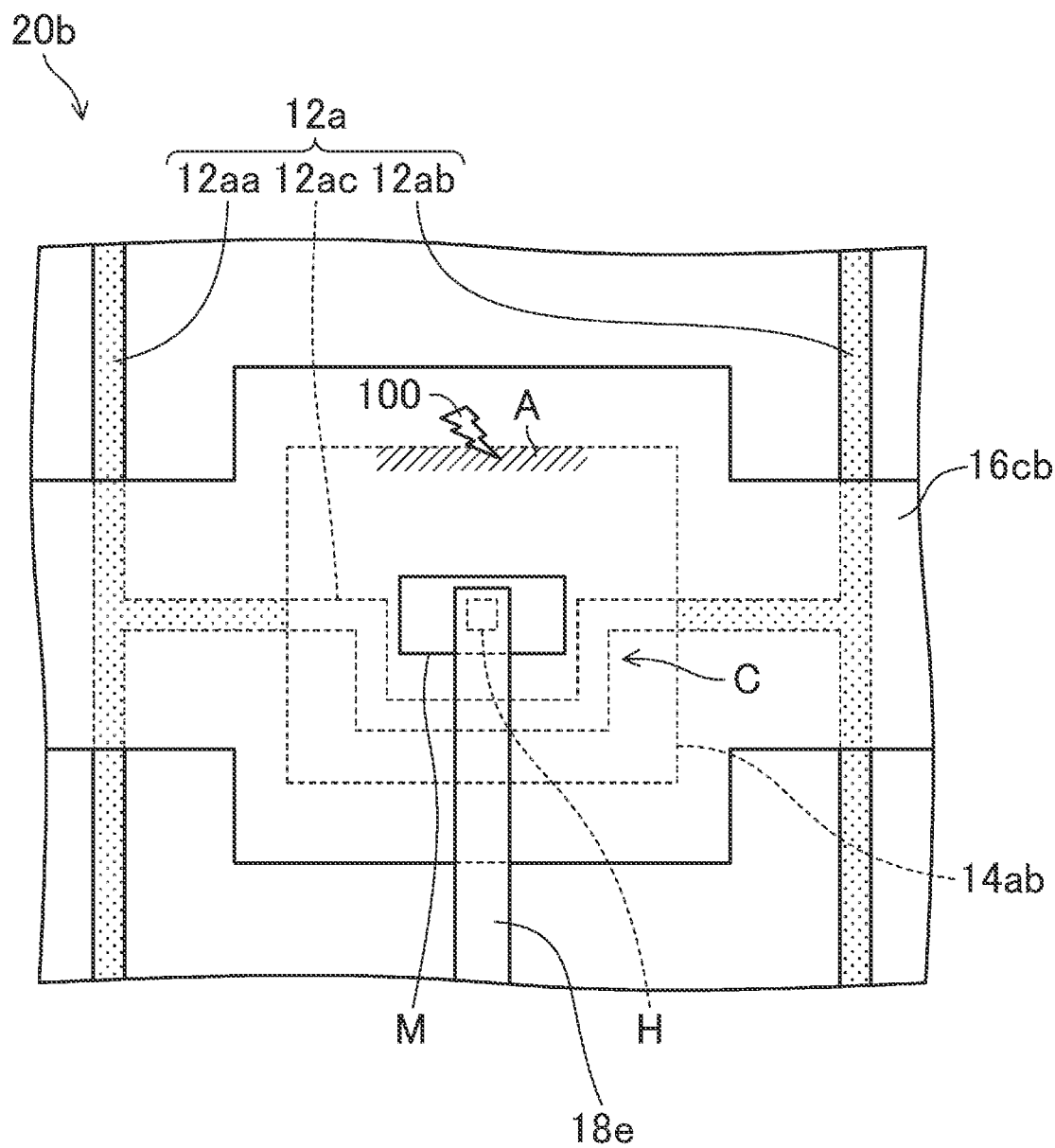
FIG. 23 illustrates, in a plan view, a step of short-circuit identification included in a modified version of the method for manufacturing the organic EL display according to the first embodiment of the disclosure.
Figure 24:
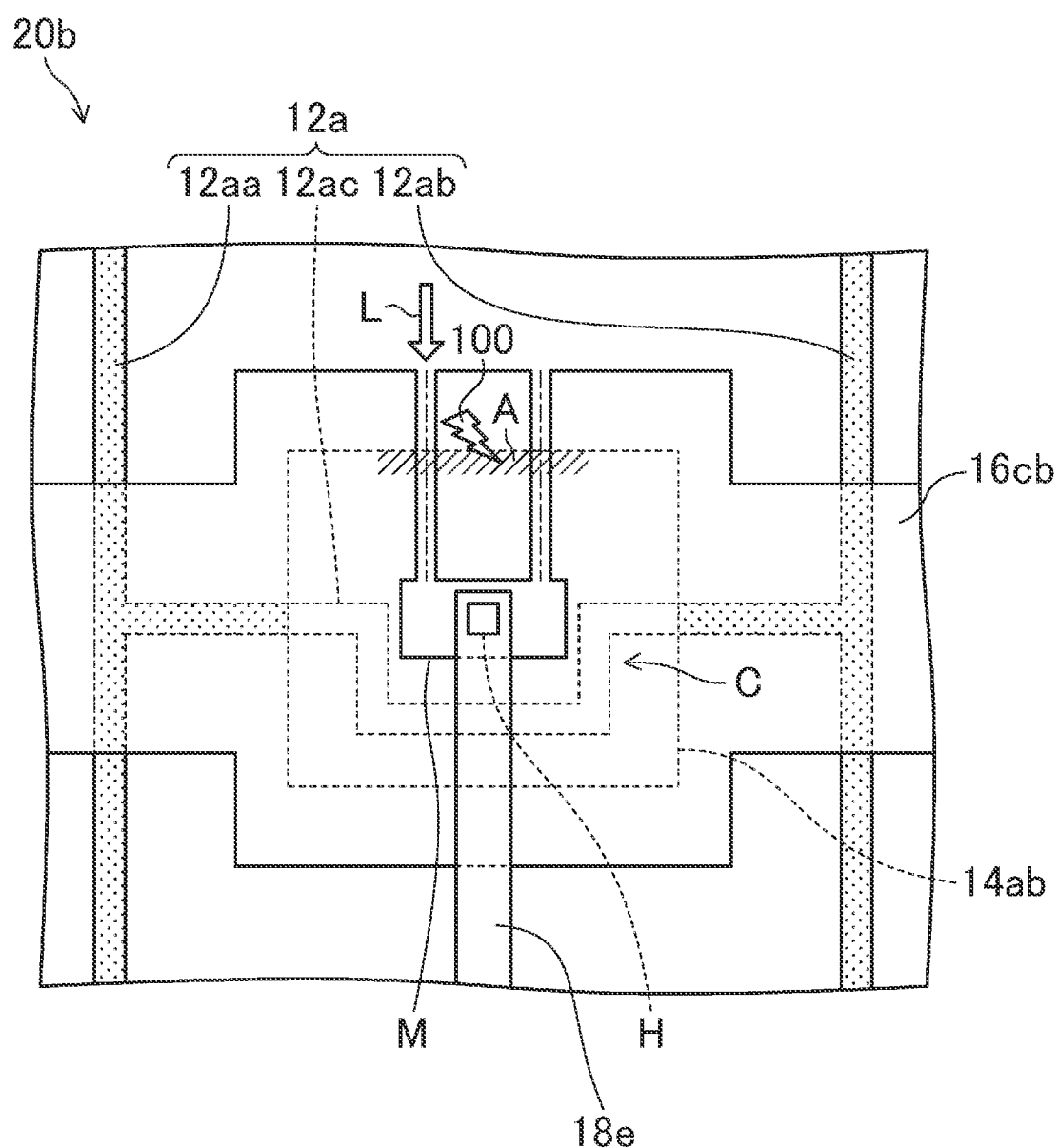
FIG. 24 illustrates, in a plan view, a correction step included in the modified version of the method for manufacturing the organic EL display according to the first embodiment of the disclosure.

This embodiment has described, by way of example, the organic EL display 50 that includes the TFT layer 20a, and has described the method for manufacturing the same. In some embodiments, an organic EL display that includes a TFT layer 20b instead of the TFT layer 20a, and a method for manufacturing the same may be provided. FIG. 22 is a plan view of the TFT layer 20b, which is a modified version of the TFT layer 20a. FIG. 23 illustrates, in a plan view, a step of short-circuit identification included in the method for manufacturing the organic EL display including the TFT layer 20b. FIG. 24 illustrates, in a plan view, a correction step included in the method for manufacturing the organic EL display including the TFT layer 20b.

The TFT layer 20b is substantially of the same configuration as the TFT layer 20a, with the exception of the shape of a gate electrode 14ab of the fourth TFT 9d and with the exception of the shape of a capacitive electrode 16cb of the capacitor 9h.

The gate electrode 14ab has a rectangular-island shape in a plan view, as illustrated in FIG. 22. The gate electrode 14ab is configured such that an angle (c.f., θa in FIG. 7) formed between the upper surface of the resin substrate layer 10 and an end surface (hatched part A in FIG. 22) on one side of the gate electrode 14ab remote from the recess C of the semiconductor layer 12a and facing the recess C is greater than an angle (c.f., θb in FIGS. 6 and 7) formed between the upper surface of the resin substrate layer 10 and an end surface of the gate electrode 14ab on the perimeter except the end surface (hatched part A in FIG. 22) facing the recess C.

As illustrated in FIG. 22, the capacitive electrode 16cb is substantially of the same configuration as the capacitive electrode 16c, with the exception that the capacitive electrode 16cb has an opening M whose width (in the lateral direction of the drawing) is wider than the width of the opening M of the capacitive electrode 16c.

Manufacturing the organic EL display including the TFT layer 20b needs the foregoing identifying step, which includes the following processing: in each of the pixel circuits 35 within the TFT layer 20b, the middle part (hatched part A in the drawing) on the upper side of the gate electrode 14ab undergoes image processing, as illustrated in FIG. 23, where an image captured by a CCD camera or other kinds of equipment is processed, to identify a pixel circuit 35 with the gate electrode 14ab and capacitive electrode 16cb developing a short-circuit resulting from ESD 100. Manufacturing the organic EL display including the TFT layer 20b also needs the foregoing correction step, which includes the following processing: the capacitive electrode 16cb undergoes scanning in such a manner as to form two straight lines (dot-dashed lines in the drawing) while irradiation with laser light L around a portion of a short-circuit between the gate electrode 14ab and capacitive electrode 16cb, as illustrated in FIG. 24, to separate the portion of the short-circuit between the gate electrode 14ab and capacitive electrode 16cb from the capacitive electrode 16cb via the opening M.

In the method for manufacturing the organic EL display including the TFT layer 20b, the gate electrode 14ab has, on its perimeter, a part (hatched part A in FIG. 22) where the angle between the upper surface of the resin substrate layer 10 and an end surface of the gate electrode 14ab is relatively large. This part (hatched part A in FIG. 22), which is narrower than the corresponding part (hatched part A in FIG. 5) in the TFT layer 20a, can facilitate detection of a short-circuit defect caused by ESD 100 in the capacitor 9h of each sub-pixel P when compared to the corresponding part in the TFT layer 20a.

As described above, the organic EL display 50 and the method for manufacturing the same according to this embodiment are configured such that the gate electrode 14a is rectangular in a plan view, and such that the angle θa, formed between the upper surface of the resin substrate layer 10 and the end surface on one side of the gate electrode 14a remote from the recess C of the semiconductor layer 12a, is greater than the angle θb, formed between the upper surface of the resin substrate layer 10 and the end surface on each of the three other sides of the gate electrode 14a including the parts overlapping the semiconductor layer 12a in a plan view. This configuration renders the first interlayer insulating film 15, formed in an anisotropic manner so as to cover the gate electrode 14a, relatively thin along the one side of the gate electrode 14a remote from the recess C of the semiconductor layer 12a, and renders the first interlayer insulating film 15 relatively thick along the three other sides of the gate electrode 14a. The first interlayer insulating film 15 consequently has relatively low pressure-resistance along the one side of the gate electrode 14a remote from the recess C of the semiconductor layer 12a. As a result, the capacitor 9h of each sub-pixel P easily has ESD 100 occurring in a location along the one side of the gate electrode 14a remote from the recess C of the semiconductor layer 12a. Accordingly, identifying a pixel circuit 35 with the gate electrode 14a and capacitive electrode 16c developing a short-circuit resulting from ESD 100 needs careful observation of the location along the one side of the gate electrode 14a remote from the recess C of the semiconductor layer 12a. In addition, correcting the pixel circuit 35 short-circuited by the ESD 100 requires the portion of the short-circuit between the gate electrode 14a and capacitive electrode 16c to be separated from the capacitive electrode 16c along the one side of the gate electrode 14a remote from the recess C of the semiconductor layer 12a. This offers an easy step of short-circuit identification and an easy correction step, thereby facilitating correction of a short-circuit defect caused by ESD 100 in the capacitor 9h of each sub-pixel P.

Other Embodiments

The foregoing embodiment has described, by way of example, an organic EL layer having a five-ply stack of a hole injection layer, a hole transport layer, a light-emitting layer, an electron transport layer and an electron injection layer. In some embodiments, an organic EL layer may be provided that has a three-ply stack of a hole injection-and-transport layer, a light-emitting layer and an electron transport-and-injection layer.

The foregoing embodiment has described, by way of example, an organic EL display that has a first electrode as an anode and a second electrode as a cathode. The disclosure is also applicable to an organic EL display in which the organic EL layer has an inverted stack of layers: the first electrode as a cathode and the second electrode as an anode.

The foregoing embodiment has described an organic EL display as a display device by way of example. The disclosure is applicable to a display device that includes a plurality of light-emitting elements driven by current. For instance, the disclosure is applicable to a display device that includes quantum-dot light-emitting diodes (QLEDs), which are light-emitting elements using a layer containing quantum dots.

INDUSTRIAL APPLICABILITY

As described above, the disclosure is useful for a flexible display device.

The invention claimed is:
1. A display device comprising:
a base substrate;
a TFT layer disposed on the base substrate, and including a plurality of pixel circuits arranged; and
a light-emitting element layer disposed on the TFT layer, the light-emitting element layer including a plurality of light-emitting elements arranged in correspondence with the plurality of pixel circuits,
wherein each of the plurality of pixel circuits includes
a TFT including a semiconductor layer, a gate insulating film, and a gate electrode, the gate insulating film covering the semiconductor layer, the gate electrode being provided in a form of an island overlapping a part of the semiconductor layer in a plan view on the gate insulating film, and
a capacitor including the gate electrode, a first inorganic insulating film, and a capacitive electrode, the first inorganic insulating film being disposed on the gate electrode, the capacitive electrode overlapping the gate electrode in the plan view on the first inorganic insulating film,
the capacitive electrode extends all around a perimeter of the gate electrode and extends to an outside of the perimeter, and
an angle formed between an upper surface of the base substrate and at least a part of an end surface in a circumferential direction of the gate electrode not overlapping the semiconductor layer in the plan view is greater than an angle formed between the upper surface of the base substrate and an end surface of the gate electrode overlapping the semiconductor layer in the plan view.
2. The display device according to claim 1, wherein the TFT is a TFT for drive.
3. The display device according to claim 2, wherein the capacitive electrode has an opening exposing the first inorganic insulating film,
the capacitive electrode is covered with a second inorganic insulating film, and
the second inorganic insulating film is covered with a connection wire electrically connected to the gate electrode via a contact hole disposed in the first and second inorganic insulating films exposed from the opening.
4. The display device according to claim 3, wherein the TFT layer includes a plurality of power-source lines extending in parallel with each other,
the capacitive electrode not overlapping the gate electrode in the plan view is electrically connected to corresponding one of the plurality of power-source lines, and
the capacitive electrode is wider in a portion overlapping the gate electrode in the plan view than in a portion not overlapping the gate electrode in the plan view.
5. The display device according to claim 3, wherein the semiconductor layer includes
a channel region overlapping the gate electrode in the plan view, and
a pair of conductor regions sandwiching the channel region, and the channel region has a middle part having a U-shape in the plan view.

6. The display device according to claim 5, wherein the opening overlaps a recess of the U-shape in the plan view.

7. The display device according to claim 6, wherein the connection wire crosses the channel region in the recess of the U-shape.

8. The display device according to claim 7, wherein the gate electrode is rectangular in the plan view, and an angle formed between the upper surface of the base substrate and an end surface on one side of the gate electrode remote from the recess of the U-shape is greater than the angle formed between the upper surface of the base substrate and the end surface of the gate electrode overlapping the semiconductor layer in the plan view.

9. The display device according to claim 7, wherein the gate electrode is rectangular in the plan view, and an angle formed between the upper surface of the base substrate and an end surface on one side of the gate electrode remote from the recess of the U-shape and facing the recess is greater than an angle formed between the upper surface of the base substrate and an end surface of the gate electrode on the perimeter except the end surface facing the recess.

10. The display device according to claim 1, wherein each of the plurality of light-emitting elements is an organic EL element.

11. A method for manufacturing a display device, comprising the steps of:

forming a TFT layer onto a base substrate, the TFT layer including a plurality of pixel circuits; and forming a light-emitting element layer onto the TFT layer, the light-emitting element layer including a plurality of light-emitting elements arranged in correspondence with the plurality of pixel circuits, wherein each of the plurality of pixel circuits includes
a TFT including a semiconductor layer, a gate insulating film, and a gate electrode, the gate insulating film covering the semiconductor layer, the gate electrode being provided in a form of an island overlapping a part of the semiconductor layer in a plan view on the gate insulating film, and a capacitor including the gate electrode, a first inorganic insulating film, and a capacitive electrode, the first inorganic insulating film being disposed on the gate electrode, the capacitive electrode overlapping the gate electrode in the plan view on the first inorganic insulating film, the capacitive electrode extends all around a perimeter of the gate electrode and extends to an outside of the perimeter, an angle formed between an upper surface of the base substrate and at least a part of an end surface in a circumferential direction of the gate electrode not overlapping the semiconductor layer in the plan view is greater than an angle formed between the upper surface of the base substrate and an end surface of the gate electrode overlapping the semiconductor layer in the plan view, and the method comprises:

a step of short-circuit identification comprising identifying, from among the plurality of pixel circuits, a pixel circuit with the gate and capacitive electrodes developing a short-circuit, the identifying step being performed between the step of forming the TFT layer and the step of forming the light-emitting element layer; and a correction step comprising laser-light irradiation around a portion of the short-circuit between the gate and capacitive electrodes in the identified pixel circuit, to separate, from the capacitive electrode, the portion of the short-circuit between the gate and capacitive electrodes, the correction step being performed between the step of forming the TFT layer and the step of forming the light-emitting element layer.

12. The method according to claim 11, wherein the TFT is a TFT for drive, the capacitive electrode has an opening exposing the first inorganic insulating film, and the correction step includes separating the portion of the short-circuit between the gate and capacitive electrodes from the capacitive electrode via the opening.

13. The method according to claim 11, wherein each of the plurality of light-emitting elements is an organic EL element.

* * * * *